(12) United States Patent
Motoyama et al.

(10) Patent No.: US 12,464,926 B2
(45) Date of Patent: Nov. 4, 2025

(54) LIGHT EMITTING DEVICE WITH LIGHT EMiTING ELEMENT DISPOSED ABOVE COLOR FILTER

(71) Applicant: Sony Semiconductor Solutions Corporation, Kanagawa (JP)

(72) Inventors: Yosuke Motoyama, Kanagawa (JP); Reo Asaki, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 4 days.

(21) Appl. No.: 18/441,383

(22) Filed: Feb. 14, 2024

(65) Prior Publication Data

US 2024/0324277 A1    Sep. 26, 2024

Related U.S. Application Data

(63) Continuation of application No. 18/048,219, filed on Oct. 20, 2022, now Pat. No. 11,997,873, which is a
(Continued)

(30) Foreign Application Priority Data

Jan. 31, 2018    (JP) .................................. 2018-014492

(51) Int. Cl.
*H10K 59/38*    (2023.01)
*H10K 59/121*   (2023.01)
(Continued)

(52) U.S. Cl.
CPC ........... *H10K 59/38* (2023.02); *H10K 59/121* (2023.02); *H10K 59/80515* (2023.02);
(Continued)

(58) Field of Classification Search
CPC ................. H10K 59/38; H10K 59/121; H10K 59/80515; H10K 59/879; H10K 59/30;
(Continued)

(56) References Cited

U.S. PATENT DOCUMENTS 7,236,223 B2 *  6/2007  Matsuyama ........ G02F 1/13394
                                                    349/123
9,614,015 B2    4/2017  Park et al.
(Continued)

FOREIGN PATENT DOCUMENTS

CN    106463080 A  *  2/2017  ......... G02F 1/13394
CN    106920818 A  *  7/2017  ........... G09G 3/3266
(Continued)

OTHER PUBLICATIONS

Japanese Office Action issued Nov. 30, 2022 for corresponding Japanese Application No. 2018-014492.

*Primary Examiner* — Ida M Soward
(74) *Attorney, Agent, or Firm* — Michael Best & Friedrich LLP

(57) ABSTRACT

In one example, a light emitting device comprises a substrate, a color filter disposed above the substrate, and a light emitting element disposed above the color filter. The light emitting element includes a first electrode, an organic layer and a second electrode. The first electrode has a recessed shape or a domed shape in a cross-sectional view, and the second electrode is disposed between the color filter and the first electrode. The light emitting element is configured to emit a light towards the substrate. A first layer is disposed between the light emitting element and the substrate, an upper surface of the first layer having the recessed shape or the domed shape in the cross-sectional view.

7 Claims, 21 Drawing Sheets

Related U.S. Application Data continuation of application No. 16/964,692, filed as application No. PCT/JP2019/003061 on Jan. 30, 2019, now Pat. No. 11,515,510.

(51) Int. Cl.
  *H10K 59/80* (2023.01)
  *G02F 1/1335* (2006.01)
  *G02F 1/1362* (2006.01)
  *H10K 59/30* (2023.01)

(52) U.S. Cl.
  CPC ..... *H10K 59/879* (2023.02); *G02F 1/133512* (2013.01); *G02F 1/133514* (2013.01); *G02F 1/136209* (2013.01); *G02F 1/136222* (2021.01); *H10K 59/30* (2023.02); *H10K 59/876* (2023.02); *H10K 59/878* (2023.02)

(58) Field of Classification Search
  CPC .. H10K 59/876; H10K 59/878; H10K 59/124; H10K 50/844; H10K 59/858; G02F 1/133512; G02F 1/133514; G02F 1/136209; G02F 1/136222
  See application file for complete search history.

(56) References Cited

U.S. PATENT DOCUMENTS

| | | | |
|---|---|---|---|
| 10,157,967 B2 * | 12/2018 | Uchida | ............... G09F 9/30 |
| 10,199,606 B2 | 2/2019 | Teramoto et al. | |
| 10,411,223 B2 | 9/2019 | Inoue et al. | |
| 10,418,583 B2 | 9/2019 | Jang et al. | |
| 10,446,626 B2 | 10/2019 | Yun et al. | |
| 10,707,285 B2 | 7/2020 | Kwon et al. | |
| 2004/0017153 A1 | 1/2004 | Nishikawa | |
| 2005/0057176 A1 | 3/2005 | Lu | |
| 2005/0062407 A1 | 3/2005 | Suh | |
| 2006/0125387 A1 | 6/2006 | Adachi et al. | |
| 2007/0096636 A1 | 5/2007 | Park et al. | |
| 2008/0024402 A1 | 1/2008 | Nishikawa et al. | |
| 2008/0224607 A1 | 9/2008 | Matsuo et al. | |
| 2012/0196388 A1 | 8/2012 | Tanaka | |
| 2014/0159022 A1 * | 6/2014 | Song | ............... H10K 71/00 257/40 |
| 2014/0312312 A1 | 10/2014 | Takii | |
| 2014/0312319 A1 | 10/2014 | Kim | |
| 2015/0084026 A1 | 3/2015 | Miyamoto | |
| 2015/0144919 A1 | 5/2015 | Matsumoto et al. | |
| 2015/0380466 A1 | 12/2015 | Koo et al. | |
| 2017/0062770 A1 | 3/2017 | Jang | |
| 2017/0077448 A1 * | 3/2017 | Sakamoto | ............ H10K 59/879 |
| 2017/0084676 A1 | 3/2017 | Jang | |
| 2017/0092705 A1 | 3/2017 | Lim et al. | |
| 2017/0155094 A1 | 6/2017 | Joung et al. | |
| 2017/0294493 A1 | 10/2017 | Yoo et al. | |
| 2018/0040854 A1 | 2/2018 | Sung et al. | |
| 2018/0053917 A1 | 2/2018 | Isaka et al. | |
| 2018/0151842 A1 | 5/2018 | Park et al. | |
| 2018/0175327 A1 | 6/2018 | Jang et al. | |
| 2018/0190932 A1 | 7/2018 | Koo et al. | |
| 2018/0197929 A1 | 7/2018 | Cho et al. | |
| 2018/0247980 A1 | 8/2018 | Jang | |

FOREIGN PATENT DOCUMENTS

| | | | | |
|---|---|---|---|---|
| JP | 2003-133057 A | | 5/2003 | |
| JP | 2013114772 A | | 6/2013 | |
| JP | 2013149536 A | | 8/2013 | |
| JP | 2014209480 A | | 11/2014 | |
| JP | 2015-118761 A | | 6/2015 | |
| JP | 2016054085 A | | 4/2016 | |
| JP | 2016081562 A | * | 5/2016 | ........... H10K 59/878 |
| WO | WO-2016185781 A1 | * | 11/2016 | ............... G09F 9/30 |
| WO | WO-2017043242 A1 | * | 3/2017 | ............... G02B 5/20 |

* cited by examiner

LIGHT EMITTING DEVICE WITH LIGHT EMiITING ELEMENT DISPOSED ABOVE COLOR FILTER

CROSS REFERENCE TO RELATED APPLICATIONS

The present application is a Continuation of application Ser. No. 18/048,219, filed Oct. 20, 2022, which is a Continuation of application Ser. No. 16/964,692, filed Jul. 24, 2020, now U.S. Pat. No. 11,515,510, issued on Nov. 29, 2022, which is a 371 National Stage Entry of International Application No.: PCT/JP2019/003061, filed on Jan. 30, 2019, which claims the benefit of Japanese Priority Patent Application JP 2018-014492 filed on Jan. 31, 2018, the entire contents of which are incorporated herein by reference.

TECHNICAL FIELD

The present disclosure relates to a light emission element and a display device including multiple light emission elements.

BACKGROUND ART

In recent years, a display device (an organic EL display) using an electroluminescence (EL) element as a light emission element has been developed. In this display device, an organic layer including at least a light emission layer and a second electrode (an upper electrode) are formed on a first electrode (a lower electrode) formed separately on each pixel, for example. Moreover, each of a red light emission element with a combination of the organic layer configured to emit white light and a red color filter, a green light emission element with a combination of the organic layer configured to emit the white light and a green color filter, and a blue light emission element with a combination of the organic layer configured to emit the white light and a blue color filter is, for example, provided as a sub-pixel, and these sub-pixels form a single pixel. Light from the light emission layer is emitted to the outside via the second electrode (the upper electrode). Then, for improving a front light extraction efficiency, an on-chip microlens is provided above the second electrode.

In the meantime, as miniaturization of the light emission element progresses, position adjustment between the organic layer and the on-chip microlens becomes difficult. Means for solving such a problem is, for example, disclosed in JP 2003-133057A or JP 2015-118761A.

A light emission device disclosed in JP 2003-133057A includes a light emission layer configured to emit light by electroluminescence, a pair of electrodes configured to apply an electric field to the light emission layer, and a substrate having a recessed portion at a surface. The light emission layer is arranged in the recessed portion of the substrate. Moreover, in a fifth embodiment, the light emission layer is formed to function as an optical lens.

Moreover, an organic EL display device disclosed in JP 2015-118761A includes a substrate, a TFT, an anode electrode having a reflection layer and a transparent electrode layer and electrically connected to the TFT, and a lens member arranged between the reflection layer and the transparent electrode layer. An organic light emission layer is formed on the transparent electrode layer, and a cathode electrode is formed on the organic light emission layer.

CITATION LIST

Patent Literature

PTL 1
JP 2003-133057A
PTL 2
JP 2015-118761A

SUMMARY

Technical Problem

However, as in the light emission device disclosed in JP 2003-133057A, the light emission layer with a variable layer thickness needs to be formed for obtaining the light emission layer functioning as the optical lens. However, formation of such a light emission layer is extremely difficult. Moreover, in the case of a structure having the lens member arranged between the reflection layer and the transparent electrode layer as in the organic EL display device disclosed in JP 2015-118761A, steps such as formation of the lens member and formation of the transparent electrode layer are increased, and it is difficult to form the organic light emission layer on the raised transparent electrode layer.

For these reasons, it is desirable to provide a light emission element including an organic layer having light emission layers and having a constant thickness and configured so that a front light extraction efficiency can be improved without a significant increase in manufacturing steps and a display device including multiple light emission elements.

Solution to Problem

According to an embodiment of the present disclosure, there is provided a light emission element including at least:
  a recessed or dome-shaped portion;
  a first electrode layer formed at least partially along a shape of a top surface of the recessed or dome-shaped portion;
  an organic layer formed on the first electrode layer at least partially along a shape of a top surface of the first electrode layer;
  a second electrode layer formed on the organic layer along a shape of a top surface of the organic layer; and a planarization layer formed on the second electrode layer,
  in which light from the organic layer is emitted to an outside via the second electrode layer and the planarization layer.

According to an embodiment of the present disclosure, there is provided a display device including:
  a first substrate and a second substrate; and
  multiple light emission elements as disclosed herein positioned between the first substrate and the second substrate and arranged in a two-dimensional manner.

Advantageous Effects of Invention

In the light emission element of an embodiment of the present disclosure and the light emission element included in the display device of an embodiment of the present disclosure (hereinafter, these light emission elements will be sometimes collectively referred to as a "light emission element etc. of an embodiment of the present disclosure"), a recessed portion or a dome-shaped portion is provided.

Thus, part of the light emitted from the organic layer is reflected on the first electrode layer, and then, is emitted from the light emission element through the organic layer, the second electrode layer, and the planarization layer. As a result, a front light extraction efficiency can be improved. In addition, manufacturing steps are not significantly increased. Moreover, the first electrode layer, the organic layer, and the second electrode layer are substantially formed along the shape of the top surface of the recessed portion, and the thickness of the organic layer is a constant thickness. Thus, as described later, a resonator structure can be easily formed. In addition, the thickness of the first electrode layer is constant, and therefore, occurrence of phenomena such as coloring and a luminance change of the first electrode layer depending on the angle of viewing the display device due to a change in the thickness of the first electrode layer can be reduced. Note that advantageous effects described in the present specification are merely examples, and the present disclosure is not limited to these examples. Moreover, additional advantageous effects may be provided.

DESCRIPTION OF EMBODIMENTS

Figure 1:
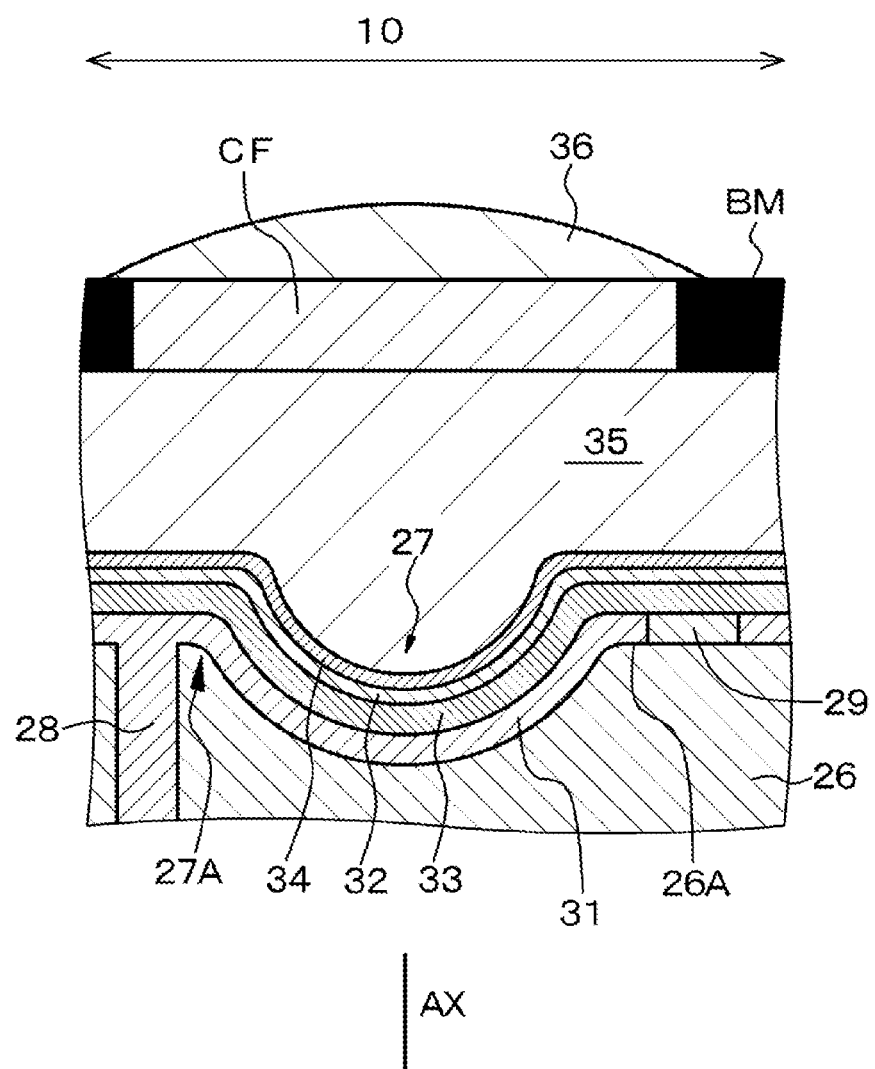
FIG. 1 is a schematic partial end view of part of a light emission element of a first embodiment.

Hereinafter, the present disclosure will be described on the basis of embodiments with reference to the drawings. However, the present disclosure is not limited to the embodiments, and various numerical values and materials in the embodiments are described by way of example. Note that description will be made in the following order:

1. General Description regarding Light Emission Element of an Embodiment of the Present Disclosure and Display Device of an embodiment of the Present Disclosure;
2. First Embodiment (Light Emission Element of an Embodiment of the Present Disclosure and Display Device of an Embodiment of the Present Disclosure);
3. Second Embodiment (Variation of First Embodiment);
4. Third Embodiment (Another Variation of First Embodiment); and
5. Other.

<General Description Regarding Light Emission Element of an Embodiment of the Present Disclosure and Display Device of an Embodiment of the Present Disclosure>

For example, the light emission element etc. of an embodiment of the present disclosure can be in such a form that a protection film is formed between a second electrode layer and a planarization layer. The protection film is preferably formed along the shape of a top surface of the second electrode layer. The protection film has the function of adjusting and controlling the angle of refraction of light passing through the protection film. Moreover, in this case, $n_1 > n_2$ is preferably satisfied when the index of refraction of a material forming the planarization layer is $n_1$ and the index of refraction of a material forming the protection film is $n_2$. The value of $(n_1 - n_2)$ can be, but not limited to, 0.1 to 0.6, for example. With such a protection film, part of light emitted from an organic layer passes through the second electrode layer and the protection film to enter the planarization layer, and part of the light emitted from the organic layer is reflected on a first electrode layer to enter the planarization layer through the organic layer, the second electrode layer, and the protection film. As described above, the protection film and the planarization layer can form an internal lens, and the light emitted from the organic layer can be condensed in a direction toward a center side of the light emission element. As a result, the efficiency of extracting front light from the light emitted from the light emission element to the outside can be improved without the need for providing an on-chip microlens above the second electrode layer.

Alternatively, the light emission element etc. of an embodiment of the present disclosure can be in such a form that $$|\theta_i|>|\theta_r|$$

is satisfied in the case of $|\theta_r|\neq 0$ when the incident angle of the light emitted from the organic layer and entering the planarization layer through the second electrode layer is $\theta_i$ and the angle of refraction of the light having entered the planarization layer is $\theta_r$. When these conditions are satisfied, part of the light emitted from the organic layer passes through the second electrode layer to enter the planarization layer, and part of the light emitted from the organic layer is reflected on the first electrode layer to enter the planarization layer through the organic layer and the second electrode layer. As described above, the internal lens can be formed, and the light emitted from the organic layer can be condensed in the direction toward the center side of the light emission element. As a result, the efficiency of extracting the front light from the light emitted from the light emission element to the outside can be improved without the need for providing the on-chip microlens above the second electrode layer.

For example, the light emission element etc. of an embodiment of the present disclosure including various preferred forms described above can be in such a form that the planarization layer has a function as a color filter. Generally, a color filter layer includes resin to which a colorant including a desired pigment or dye is added. By selection of the pigment or dye, it is adjusted such that a light transmission rate in intended wavelength ranges for the colors of red, green, blue, and the like is high and a light transmission rate in other wavelength ranges is low. The planarization layer having the function as the color filter may include a well-known color resist material. In a later-described light emission element configured to emit white light, a transparent filter may be arranged. Since the planarization layer also functions as the color filter as described above, the organic layer and the planarization layer are close to each other. Thus, even when the angle of the light emitted from the light emission element is widened, color mixing can be effectively prevented, and viewing angle characteristics are improved. The color filter layer may be formed on the planarization layer separately and independently from the planarization layer.

Further, the light emission element etc. of an embodiment of the present disclosure including various preferred forms described above may be configured such that an on-chip microlens is provided on or above a top surface of the planarization layer. With the on-chip microlens, the light from the organic layer can be released in a desired state, and as a result, the viewing angle characteristics can be controlled. For example, the on-chip microlens includes well-known acrylic-based resin. The on-chip microlens can be obtained by melt flow or etching back of the acrylic-based resin. The above-described internal lens exclusively plays a role in improvement of the efficiency of extracting the front light from the light emitted from the light emission element to the outside, and for this reason, on-chip microlens position adjustment accuracy is not necessary high. The same applies to description below.

Further, the light emission element etc. of an embodiment of the present disclosure including various preferred forms/configurations described above may be configured such that the first electrode layer contacts part of the organic layer or that the organic layer contacts part of the first electrode layer. Specifically, in this case, it may be configured such that the size of the first electrode layer is smaller than that of the organic layer or that the size of the first electrode layer is the same as that of the organic layer, but an insulating material film is formed at part of a portion between the first electrode layer and the organic layer. Alternatively, it may be configured such that the size of the first electrode layer is larger than that of the organic layer. Moreover, in this case, it may be configured such that the color filter layer is formed on the planarization layer and a direction from the axis of the recessed portion toward a center point of the first electrode layer contacting the organic layer and a direction from the axis of the recessed portion toward a center point of the color filter layer are in the relationship of opposite directions. The above-described "center point" is a center point upon orthogonal projection on a virtual plane (hereinafter referred to as a "base virtual plane") including the surface of the base, and will be hereinafter sometimes referred to as an "orthogonal projection center point" for the sake of convenience. Moreover, the above-described "direction" is a direction upon orthogonal projection on the base virtual plane, and will be hereinafter sometimes referred to as an "orthogonal projection direction" for the sake of convenience. A distance $PL_1$ from the axis of the recessed portion to the center point (the orthogonal projection center point) of the first electrode layer contacting the organic layer and a distance $PL_2$ from the axis of the recessed portion to the center point (the orthogonal projection center point) of the color filter layer are preferably greater as the position of the light emission element is closer to a peripheral portion of the display device. The above-described "distance" is a distance upon orthogonal projection on the base virtual plane, and will be hereinafter sometimes referred to as an "orthogonal projection distance" for the sake of convenience. The center point (the orthogonal projection center point) of the first electrode layer, the center point (the orthogonal projection center point) of the organic layer, and an intersection between the axis of the recessed portion and the base virtual plane are preferably positioned on a substantially straight line.

Alternatively, the light emission element etc. of an embodiment of the present disclosure including various preferred forms described above may be configured such that the on-chip microlens is provided on or above the top surface of the planarization layer, the first electrode layer contacts part of the organic layer, and the direction (the orthogonal projection direction) from the axis of the recessed portion to the center point (the orthogonal projection center point) of the first electrode layer contacting the organic layer and a direction (the orthogonal projection direction) from the axis of the recessed portion to a center point (the orthogonal projection center point) of the on-chip microlens are in the relationship of opposite directions. Moreover, in this case, it may be configured such that the on-chip microlens is larger than the recessed portion. A distance (the orthogonal projection distance) $PL_1'$ from the axis of the recessed portion to the center point (the orthogonal projection center point) of the first electrode layer and a distance (the orthogonal projection distance) $PL_2'$ from the axis of the recessed portion to the center point (the orthogonal projection center point) of the on-chip microlens are preferably greater as the position of the light emission element is closer to the peripheral portion of the display device. An orthogonal projection image of the center point (the orthogonal projection center point) of the first electrode layer, an orthogonal projection image of the center point (the orthogonal projection center point) of the organic layer, and an orthogonal projection image of the center point (the orthogonal projection center point) of the on-chip microlens are preferably positioned on a substantially straight line. The first electrode layer contacts part of the organic layer. Specifically, it may be configured such that the size of the first electrode layer is smaller than that of the organic layer or the size of the first electrode layer is the same as that of the organic layer, but the insulating material film is formed at part of the portion between the first electrode layer and the organic layer. Alternatively, it may be configured such that the size of the first electrode layer is larger than that of the organic layer.

Further, the light emission element etc. of an embodiment of the present disclosure including the preferred forms/configurations described above may be configured such that the sectional shape of the recessed portion when the recessed portion is cut at the virtual plane including the axis of the recessed portion is a smooth curve or part of a trapezoidal shape. Alternatively, it may be configured such that the sectional shape is a combination of a linear inclined surface and a bottom portion defining a smooth curve.

Further, the light emission element etc. of an embodiment of the present disclosure including the preferred forms/configurations described above may be in such a form that a sectional shape from an edge portion of the recessed portion to the surface of the base when the recessed portion is cut at the virtual plane including the axis of the recessed portion includes a smooth curve. That is, the edge portion of the recessed portion is preferably rounded, and therefore, disconnection is less caused at various layers formed on the recessed portion.

Further, the light emission element etc. of an embodiment of the present disclosure including the preferred forms/configurations described above may be, but not limited to, in such a form that the shape of the edge portion of the recessed portion is a circular shape or an oval shape. When the diameter of a circle assumed to have an area equal to that of the shape of the orthogonal projection image of the recessed portion when the recessed portion is orthogonally projected on the base virtual plane is R and the depth of the recessed portion is Dp, $$\frac{1}{4} \leq Dp/R \leq \frac{1}{2}$$

is preferably satisfied.

Further, the light emission element etc. of an embodiment of the present disclosure including the preferred forms/configurations described above may be in such a form that the organic layer emits white light. In this case, the organic layer may be in a form with a multilayer structure of a red light emission layer, a green light emission layer, and a blue light emission layer. Alternatively, the organic layer may have such a structure that two layers of the blue light emission layer configured to emit blue light and a yellow light emission layer configured to emit yellow light are stacked on each other, and therefore, emits the white light across the entirety thereof. Alternatively, a structure may be employed, in which two layers of the blue light emission layer configured to emit the blue light and an orange light emission layer configured to emit orange light are stacked on each other. Thus, the organic layer emits the white light across the entirety thereof. The common organic layer may be used for multiple light emission elements, or the organic layer may be separately provided on each light emission element.

Examples of a material forming the planarization layer may include a material whose index of refraction is adjusted (increased) by addition of $TiO_2$ to a base material including acrylic-based resin, and a material whose index of refraction is adjusted (increased) by addition of $TiO_2$ to a base material including the same type of material (note that a clear and colorless material to which no pigment is added) as a color resist material. Moreover, examples of a material forming the protection film may include SiN, SiON, $Al_2O_3$, and $TiO_2$. Further, examples of a preferable combination of (the material forming the planarization layer, the material forming the protection film) may include (acrylic-based resin, a single SiN layer), (acrylic-based resin, a multilayer structure of a SiN layer and $Al_2O_3$ layer), (acrylic-based resin, a multilayer structure of a SiN layer, an $Al_2O_3$ layer, and a $TiO_2$ layer), and (acrylic-based resin, a single $Al_2O_3$ layer). In the method for forming the planarization layer or the protection film, formation can be performed on the basis of a well-known method such as various CVD methods, various coating methods, various PVD methods including a sputtering method and a vacuum deposition method, and various printing methods including a screen printing method. Further, an atomic layer deposition (ALD) method may be employed as the method for forming the protection film. The common planarization layer and protection film may be used for multiple light emission elements, or the planarization layer and the protection film may be separately provided for each light emission element.

An etching back method may be employed as the method for providing the recessed portion at the surface of the base. That is, after a resist layer has been formed on the surface of the base and a shape for forming the recessed portion has been provided to the resist layer, the resist layer and the base are dry-etched on the basis of, e.g., a RIE method, and in this manner, the recessed portion can be formed at the surface of the base. Alternatively, after a resist layer having an opening has been formed on the surface of the base, the base is, for example, wet-etched via the opening provided at the resist layer, and in this manner, the recessed portion can be formed at the surface of the base.

The display device of an embodiment of the present disclosure including various preferred forms/configurations described above may include an organic electroluminescence display device (an organic EL display device). Moreover, the light emission element etc. of an embodiment of the present disclosure including various preferred forms/configurations described above may include an organic electroluminescence element (an organic EL element).

In the light emission element etc. of an embodiment of the present disclosure, the organic layer may be, as described above, in such a form that the organic layer includes at least two layers of the light emission layers configured to emit light in different colors. In this case, the form may be employed, in which the light emitted from the organic layer is the white light. Specifically, the organic layer may have such a structure that three layers of the red light emission layer configured to emit red light (a wavelength: 620 nm to 750 nm), the green light emission layer configured to emit green light (a wavelength: 495 nm to 570 nm), and the blue light emission layer configured to emit blue light (a wavelength: 450 nm to 495 nm) are stacked on each other, and therefore, emits the white light across the entirety thereof. Alternatively, the structure may be employed, in which two layers of the blue light emission layer configured to emit the blue light and the yellow light emission layer configured to emit the yellow light are stacked on each other. Thus, the organic layer emits the white light across the entirety thereof.

Alternatively, the structure may be employed, in which two layers of the blue light emission layer configured to emit the blue light and the orange light emission layer configured to emit the orange light are stacked on each other. Thus, the organic layer emits the white light across the entirety thereof. Moreover, the organic layer configured to emit the white light and a red color filter layer (or a planarization layer functioning as a red color filter) are combined to form a red light emission element. The organic layer configured to emit the white light and a green color filter layer (or a planarization layer functioning as a green color filter) are combined to form a green light emission element. The organic layer configured to emit the white light and a blue color filter layer (or a planarization layer functioning as a blue color filter) are combined to form a blue light emission element. Moreover, a combination of sub-pixels such as the red light emission element, the green light emission element, and the blue light emission element form a single pixel. In some cases, the red light emission element, the green light emission element, the blue light emission element, and a light emission element configured to emit white light (or a light emission element configured to emit light in a complementary color) may form a single pixel. In the form in which the organic layer includes at least two layers of the light emission layers configured to emit the light in different colors, there is actually a case where the light emission layers configured to emit the light in different colors are mixed and not distinctly separated into each layer.

Alternatively, the organic layer may be in such a form that the organic layer includes a single layer of the light emission layer. In this case, the light emission element may include, for example, the red light emission element having the organic layer with the red light emission layer, the green light emission element having the organic layer with the green light emission layer, or the blue light emission element having the organic layer with the blue light emission layer. In the case of the display device for color displaying, these three types of light emission elements (sub-pixels) form a single pixel. Alternatively, the organic layer may include a multilayer structure of the red light emission element having the organic layer with the red light emission layer, the green light emission element having the organic layer with the green light emission layer, and the blue light emission element having the organic layer with the blue light emission layer.

A black matrix layer may be formed between the color filter layer and the color filter layer or between the light emission element and the light emission element. For example, the black matrix layer includes a black resin film (specifically, e.g., black polyimide resin) mixed with a black colorant and having an optical density of equal to or greater than 1 or a thin film filter utilizing interference of a thin film. The thin film filter is, for example, configured such that two or more layers of thin films including metal, metal nitride, or metal oxide are stacked on each other, and is configured to utilize interference of the thin films to attenuate light. Specifically, the thin film filter may be configured such that Cr and chromium oxide (III) ($Cr_2O_3$) are alternately stacked on each other.

In the light emission element etc. of an embodiment of the present disclosure, the base is formed on or above the first substrate. Examples of a material forming the base may include insulating materials such as $SiO_2$, SiN, and SiON. Alternatively, an insulating layer etc. formed on or above the base and an insulating material with an etching selection ratio may form the base. The base can be formed on the basis of a formation method suitable for the material forming the base, specifically a well-known method such as various CVD methods, various coating methods, various PVD methods including the sputtering method and the vacuum deposition method, various printing method including the screen printing method, a plating method, an electrodeposition method, a dipping method, and a sol-gel method, for example.

A light emission element drive portion is, but not limited to, provided below the base. For example, the light emission element drive portion includes a transistor (specifically, e.g., a MOSFET) formed on a silicon semiconductor substrate forming the first substrate or a thin film transistor (TFT) provided on various substrates forming the first substrate. The transistor or the TFT forming the light emission element drive portion and the first electrode layer may be in such a form that the transistor or the TFT and the first electrode layer are connected via a contact hole (a contact plug) formed at the base etc. The light emission element drive portion may have a well-known circuit configuration. The second electrode layer is, at an outer peripheral portion of the display device, connected to the light emission element drive portion via the contact hole (the contact plug) formed at the base etc. The light emission element is formed on a first substrate side. The second electrode layer may be a common electrode layer for multiple light emission elements. That is, the second electrode layer may be a so-called solid electrode.

The display device of an embodiment of the present disclosure is a top emission (top face emission) display device (a top face emission display device) configured to emit light from a second substrate. In the top face emission display device, the color filter layer and the black matrix layer may be, for example, formed above the first substrate.

In the display device of an embodiment of the present disclosure, delta arrangement may be employed as pixel (or sub-pixel) arrangement. Alternatively, stripe arrangement, diagonal arrangement, rectangle arrangement, or pen-tile arrangement may be employed.

The first substrate or the second substrate may include a silicon semiconductor substrate, a high distortion point glass substrate, a soda-lime glass ($Na_2O \cdot CaO \cdot SiO_2$) substrate, a borosilicate glass ($Na_2O \cdot B_2O_3 \cdot SiO_2$) substrate, a forsterite ($2MgO \cdot SiO_2$) substrate, a lead glass ($Na_2O \cdot PbO \cdot SiO_2$) substrate, various glass substrates having insulating material layers formed on surfaces, a quartz substrate, a quartz substrate having an insulating material layer formed on a surface, and organic polymers (having polymer material forms such as a plastic film, a plastic sheet, and a plastic substrate including a polymer material and exhibiting flexibility) including, for example, poly methyl methacrylate (polymethylmethacrylate, PMMA), polyvinyl alcohol (PVA), polyvinyl phenol (PVP), polyether sulfone (PES), polyimide, polycarbonate, and polyethyleneterephthalate (PET). Materials forming the first substrate and the second substrate may be the same as each other or different from each other. Note that it has been demanded that the second substrate is transparent to the light from the light emission element.

In a case where the first electrode layer functions as an anode electrode, a material forming the first electrode layer may include, for example, metal or alloy (e.g., Ag—Pd—Cu alloy including silver as a main component, 0.3% by mass to 1% by mass of palladium (Pd), and 0.3% by mass to 1% by mass of copper (Cu) or Al—Nd alloy) with a high work function, such as platinum (Pt), gold (Au), silver (Ag), chromium (Cr), tungsten (W), nickel (Ni), copper (Cu), iron (Fe), cobalt (Co), and tantalum (Ta). Further, in the case of using a conductive material with a small work function value and high optical reflectance, such as aluminum (Al) and alloy including aluminum, a proper hole injection layer is, for example, provided to improve hole injection characteristics, and in this manner, use as the anode electrode is available. The thickness of the first electrode layer may be, for example, 0.1 μm to 1 μm. Alternatively, in the case of providing a later-described light reflection layer, the material forming the first electrode layer may include, for example, various transparent conductive materials such as transparent conductive materials using, as base layers, indium oxide, indium-tin oxide (including ITO, indium tin oxide, Sn-doped $In_2O_3$, crystalline ITO, and amorphous ITO), indium-zinc oxide (IZO, indium zinc oxide), indium-gallium oxide (IGO), indium-doped gallium-zinc oxide (IGZO, In—$GaZnO_4$), IFO (F-doped $In_2O_3$), ITiO (Ti-doped $In_2O_3$), InSn, InSnZnO, tin oxide ($SnO_2$), ATO (Sb-doped $SnO_2$), FTO (F-doped $SnO_2$), zinc oxide (ZnO), aluminum oxide-doped zinc oxide (AZO), gallium-doped zinc oxide (GZO), B-doped ZnO, AlMgZnO (aluminum oxide and magnesium oxide-doped zinc oxide), antimony oxide, titanium oxide, Nio, spinel type oxide, oxide having a $YbFe_2O_4$ structure, gallium oxide, titanium oxide, niobium oxide, and nickel oxide. Alternatively, a structure may be employed, in which a transparent conductive material exhibiting excellent hole injection characteristics, such as indium-tin oxide (ITO) or indium-zinc oxide (IZO), is stacked on a dielectric multilayer film or a reflection film exhibiting high optical reflectance, such as aluminum (Al). On the other hand, in a case where the first electrode layer functions as a cathode electrode, the first electrode layer preferably includes a conductive material having a small work function value and high optical reflectance. However, a proper electron injection layer is, for example, provided at the conductive material used as the anode electrode and having high optical reflectance to improve electron injection characteristics. In this manner, use as the cathode electrode is available.

In a case where the second electrode layer functions as a cathode electrode, a material (a semi-light transmission material or light transmission material) forming the second electrode layer preferably includes a conductive material with a small work function value so that transmission of the emitted light is allowed and electrons can be efficiently injected to the organic layer (the light emission layer). Examples of the material may include metal or alloy with a small work function, such as aluminum (Al), silver (Ag), magnesium (Mg), calcium (Ca), sodium (Na), strontium (Sr), alkali metal or alkali earth metal and silver (Ag) [e.g., alloy (Mg—Ag alloy) of magnesium (Mg) and silver (Ag)], magnesium-calcium alloy (Mg—Ca alloy), and alloy (Al—Li alloy) of aluminum (Al) and lithium (Li). Among these materials, the Mg—Ag alloy is preferable, and a volume ratio between magnesium and silver may be, for example, Mg:Ag=5:1 to 30:1. Alternatively, a volume ratio between magnesium and calcium may be, for example, Mg:Ca=2:1 to 10:1. The thickness of the second electrode layer may be, for example, 4 nm to 50 nm, preferably 4 nm to 20 nm, and more preferably 6 nm to 12 nm. Alternatively, the second electrode layer may have, for example, a multilayer structure of the above-described material layer and a so-called transparent electrode (e.g., a thickness of $3\times10^{-8}$ m to $1\times10^{-6}$ m) including ITO or IZO in this order from an organic layer side. A bus electrode (an auxiliary electrode) including a low-resistance material such as aluminum, aluminum alloy, silver, silver alloy, copper, copper alloy, gold, or gold alloy may be provided at the second electrode layer to reduce resistance across the entirety of the second electrode layer. The average light transmission rate of the second electrode layer is 50% to 90%, and preferably 60% to 90%. On the other hand, in a case where the second electrode layer functions as an anode electrode, the second electrode layer preferably includes a conductive material allowing transmission of the emitted light and having a great work function value.

The method for forming the first electrode layer or the second electrode layer may include, for example, vapor deposition methods including an electron beam deposition method, a hot filament deposition method, and the vacuum deposition method, the sputtering method, the chemical vapor deposition method (the CVD method) or a MOCVD method, a combination of an ion plating method and an etching method, various printing methods such as the screen printing method, an inkjet printing method, and a metal mask printing method, the plating method (an electroplating method or an electroless plating method), a liftoff method, a laser abrasion method, and the sol-gel method. According to various printing methods and the plating method, the first electrode layer and the second electrode layer having a desired shape (pattern) can be directly formed. Note that specifically in the case of forming the second electrode layer after the organic layer has been formed, such formation is preferably performed on the basis of a film formation method with low film-forming particle energy, such as the vacuum deposition method, or a film formation method such as the MOCVD method, considering prevention of occurrence of damage of the organic layer. When damage occurs in the organic layer, there is a probability that a non-light emission pixel (or a non-light emission sub-pixel) called a "dark spot" due to occurrence of current leakage is caused.

The organic layer includes the light emission layer having an organic light emission material. Specifically, the organic layer may include, for example, a multilayer structure of a hole transport layer, the light emission layer, and an electron transport layer, a multilayer structure of a hole transport layer and the light emission layer also serving as an electron transport layer, a multilayer structure of a hole injection layer, a hole transport layer, the light emission layer, an electron transport layer, and an electron injection layer, or the like. The method for forming the organic layer may include, for example, a physical vapor deposition method (a PVD method) such as the vacuum deposition method, printing methods such as the screen printing method and the inkjet printing method, a laser transfer method for irradiating, with a laser, a multilayer structure of a laser absorption layer and an organic layer formed on a transfer substrate to separate the organic layer on the laser absorption layer to transfer the organic layer, and various coating methods. In the case of forming the organic layer on the basis of the vacuum deposition method, the organic layer can be obtained in such a manner that a material having passed through an opening provided at the so-called metal mask is deposited using the metal mask, for example.

A light shielding layer may be provided between the light emission element and the light emission element. Specifically, a light shielding material forming the light shielding layer may include, specifically, materials which can shield light, such as titanium (Ti), chromium (Cr), tungsten (W), tantalum (Ta), aluminum (Al), and $MoSi_2$. The light shielding layer can be formed by vapor deposition methods including the electron beam deposition method, the hot filament deposition method, and the vacuum deposition method, the sputtering method, the CVD method, the ion plating method, or the like.

On the outermost surface (specifically an outer surface of the second substrate) of the display device configured to emit the light, an ultraviolet absorption layer, a pollution prevention layer, a hard coat layer, and a charging prevention layer may be formed, or a protection member (e.g., a cover glass) may be arranged.

In the display device of an embodiment of the present disclosure, an insulating layer or an interlayer insulating layer is formed. An insulating material forming these layers may include, for example, $SiO_X$-based materials (materials forming a silicon-based oxide film) such as $SiO_2$, non-doped silicate glass (NSG), boron phosphorus silicate glass (BPSG), PSG, BSG, AsSG, SbSG, PbSG, spin-on-glass (SOG), low temperature oxide (LTO, low temperature CVD-$SiO_2$), low melting point glass, and glass paste, a SiN-based material including a SiON-based material, SiOC, SiOF, and SiCN. Alternatively, the insulating material may include inorganic insulating materials such as titanium oxide ($TiO_2$), tantalum oxide ($Ta_2O_5$), aluminum oxide ($Al_2O_3$), magnesium oxide (MgO), chromium oxide ($CrO_X$), zirconium oxide ($ZrO_2$), niobium oxide ($Nb_2O_5$), tin oxide ($SnO_2$), and vanadium oxide ($VO_X$). Alternatively, the insulating material may include, for example, various types of resin such as polyimide-based resin, epoxy-based resin, and acrylic resin, and low-permittivity insulating materials (e.g., materials with a permittivity k ($=\varepsilon/\varepsilon_0$) of equal to or less than 3.5, for example, specifically fluorocarbon, cycloperfluorocarbon polymer, benzocyclobutene, cyclic fluorine resin, polytetrafluoroethylene, amorphous tetrafluoroethylene, polyarylether, fluorinated arylether, fluorinated polyimide, amorphous carbon, parylene (polyparaxylylene), and fluorinated fullerene, for example) such as SiOCH, organic SOG, and fluorine-based resin. Moreover, the insulating material may include, for example, Silk (a trademark of The Dow Chemical Co., and a coating type low-permittivity interlayer insulating film material) and Flare (a trademark of Honeywell Electronic Materials Co., and a polyarylether (PAE)-based material). Further, these materials may be used alone or in combination as necessary. In some cases, the base or the insulating material film may include the above-described materials. The insulating layer, the interlayer insulating layer, the base, and the insulating material film may be formed on the basis of a well-known method such as various CVD methods, various coating methods, various PVD methods including the sputtering method and the vacuum deposition method, various printing methods such as the screen printing method, the plating method, the electrodeposition method, the dipping method, and the sol-gel method.

For further improving the light extraction efficiency, the organic EL display device preferably has a resonator structure. Specifically, the light emitted from the light emission layer is resonated between a first interface (or a first interface formed by an interface between the light reflection layer provided below the first electrode layer and a portion of the interlayer insulating layer positioned on the light reflection layer) formed by an interface between the first electrode layer and the organic layer and a second interface formed by an interface between the second electrode layer and the organic layer, and part of the resultant light is emitted from the second electrode layer. The light reflection layer provided below the first electrode layer and the interlayer insulating layer positioned on the light reflection layer are also formed along the shape of a top surface of the recessed portion. Moreover, when a distance from the maximum light emission position of the light emission layer to the first interface is $L_1$, an optical distance is $OL_1$, a distance from the maximum light emission position of the light emission layer to the second interface is $L_2$, an optical distance is $OL_2$, and $m_1$ and $m_2$ are integers, the following expressions (1-1), (1-2), (1-3), and (1-4) are satisfied:

$$\{-\Phi_1/(2\pi) + m_1\} \le 2 \times OL_1/\lambda \le 1.2\{-\Phi_1/(2\pi) + m_1\}; \quad (1\text{-}1)$$

$$\{-\Phi_2/(2\pi) + m_2\} \le 2 \times OL_2/\lambda \le 1.2\{-\Phi_2/(2\pi) + m_2\}; \quad (1\text{-}2)$$

$$L_1 < L_2; \text{ and} \quad (1\text{-}3)$$

$$m_1 < m_2, \quad (1\text{-}4)$$

where λ: the maximum peak wavelength (or a desired wavelength in the light generated from the light emission layer) of the spectrum of the light generated from the light emission layer, $\Phi_1$: the phase shift amount (units: radian) of light reflected on the first interface, note that $-2\pi < \Phi_1 \le 0$, and $\Phi_2$: the phase shift amount (units: radian) of light reflected on the second interface, note that $-2\pi < \Phi_2 \le 0$.

A form may be employed herein, in which $m_1=0$ and $m_2=1$ are satisfied for increasing the light extraction efficiency the most.

A distance $L_1$ from the maximum light emission position of the light emission layer to the first interface indicates an actual distance (a physical distance) from the maximum light emission position of the light emission layer to the first interface, and a distance $L_2$ from the maximum light emission position of the light emission layer to the second interface indicates an actual distance (a physical distance) from the maximum light emission position of the light emission layer to the second interface. Moreover, the optical distance is also called an optical path length, and generally indicates n×L when a light beam passes through a medium with a refractive index n by a distance L. The same applies to description below. Thus, when an average refractive index is $n_{ave}$, there is a relationship in which $$OL_1 = L_1 \times n_{ave}, \text{ and}$$

$$OL_2 = L_2 \times n_{ave}.$$

In this relationship, the average refractive index nave is obtained in such a manner that the product of the refractive index and the thickness of each layer forming the organic layer (or the organic layer and the interlayer insulating layer) is added up and the resultant value is divided by the thickness of the organic layer (or the organic layer and the interlayer insulating layer).

The first electrode layer or the light reflection layer and the second electrode layer absorb part of incident light, and reflect the remaining incident light. Thus, a phase shift is caused in the reflected light. These phase shift amounts $\Phi_1$ and $\Phi_2$ can be obtained in such a manner that the values of a real number portion and an imaginary number portion of a complex refractive index of the materials forming the first electrode or the light reflection layer and the second electrode layer are measured using, e.g., an ellipsometer and calculation based on these values is performed (see, e.g., "Principles of Optic," Max Born and Emil Wolf, 1974 (PERGAMON PRESS)). The indices of refraction of the organic layer, the interlayer insulating layer, etc. can be also obtained by measurement using the ellipsometer.

A material forming the light reflection layer may include, for example, aluminum, aluminum alloy (e.g., Al—Nd or Al—Cu), an Al/Ti multilayer structure, an Al—Cu/Ti multilayer structure, chromium (Cr), silver (Ag), and silver alloy (e.g., Ag—Pd—Cu, Ag—Sm—Cu). For example, the light reflection layer may be formed by vapor deposition methods including the electron beam deposition method, the hot filament deposition method, and the vacuum deposition method, the sputtering method, the CVD method, the ion plating method, the plating method (the electroplating method or the electroless plating method), the liftoff method, the laser abrasion method, the sol-gel method, and the like.

As described above, in the organic EL display device having the resonator structure, the red light emission element including a combination of the organic layer configured to emit the white light and the red color filter layer (or the planarization layer functioning as the red color filter) actually resonates the red light emitted from the light emission layer, thereby emitting light (light having a peak of an optical spectrum in a red range) with redness from the second electrode layer. Moreover, the green light emission element including a combination of the organic layer configured to emit the white light and the green color filter layer (or the planarization layer functioning as the green color filter) resonates the green light emitted from the light emission layer, thereby emitting light (light having the peak of the optical spectrum in a green range) with greenness from the second electrode layer. Further, the blue light emission element including a combination of the organic layer configured to emit the white light and the blue color filter layer (or the planarization layer functioning as the blue color filter) resonates the blue light emitted from the light emission layer, thereby emitting light (light having the peak of the optical spectrum in a blue range) with blueness from the second electrode layer. That is, a desired wavelength $\lambda$ (specifically, the wavelength for the color of red, the wavelength for the color of green, and the wavelength for the color of blue) in the light generated from the light emission layer is determined, and various parameters such as $OL_1$ and $OL_2$ in each of the red light emission element, the green light emission element, and the blue light emission element are obtained on the basis of the expressions (1-1), (1-2), (1-3), and (1-4). In this manner, each light emission element may be designed. For example, a paragraph of JP 2012-216495A discloses an organic EL element having a resonator structure in which an organic layer serves as a resonator, and a distance from a light emission point to a reflection surface can be properly adjusted. Thus, it is described such that the thickness of the organic layer is preferably equal to or greater than 80 nm and equal to or less than 500 nm, and more preferably equal to or greater than 150 nm and equal to or less than 350 nm.

In the organic EL display device, the thickness of the hole transport layer (a hole supply layer) and the thickness of the electron transport layer (an electron supply layer) are preferably substantially equal to each other. Alternatively, the electron transport layer (the electron supply layer) may be thicker than the hole transport layer (the hole supply layer).

With this configuration, sufficient electrons necessary for increasing an efficiency can be supplied to the light emission layer with a low drive voltage. That is, the hole transport layer is arranged between the first electrode layer equivalent to the anode electrode and the light emission layer, and is formed to have a smaller thickness than that of the electron transport layer. Thus, a hole supply can be increased. Moreover, with this configuration, carrier balance is obtained such that a carrier supply amount is sufficiently great without excess or deficiency of holes and electrons. Thus, a high light emission efficiency can be obtained. Moreover, since there is no excess or deficiency of the holes and the electrons, the carrier balance is less disrupted, degradation of driving can be reduced, and a light emission life can be extended.

The display device can be, for example, used as a monitor device forming a personal computer, or can be used as a monitor device incorporated into a television image receiver, a mobile phone, a personal digital assistant (PDA), and a game machine. Alternatively, the display device can be applied to an electronic view finder (EVF) or a head mounted display (HMD). Alternatively, the display device may form an image display device in an electronic book, an electronic paper such as an electronic newspaper, a sign, a poster, a bulletin board such as a blackboard, rewritable paper as a substitute for printer paper, a display of a home electric appliance, a card display such as a club card, an electronic ad, and an electronic POP. The display device of an embodiment of the present disclosure may be used as the light emission device to form various illumination devices including a backlight device or a planar light source device for a liquid crystal display device. The head mounted display includes, for example, (a) a frame attached to the head of an observer, and
(b) an image display device attached to the frame, the image display device includes
(A) the display device of an embodiment of the present disclosure, and
(B) an optical device to which the light emitted from the display device of an embodiment of the present disclosure enters and from which such light is emitted, and the optical device includes
(B-1) a light guide plate configured such that after having propagated inside by total reflection, the light having entered from the display device of an embodiment of the present disclosure is emitted to the observer,
(B-2) first polarization unit (including, e.g., a volume hologram diffraction grating film) configured to polarize the light having entered the light guide plate such that the light having entered the light guide plate is totally reflected inside the light guide plate, and
(B-3) second polarization unit (including, e.g., a volume hologram diffraction grating film) configured to polarize, multiple times, the light having propagated inside the light guide plate by total reflection such that the light having propagated inside the light guide plate by total reflection is emitted from the light guide plate.

First Embodiment

A first embodiment relates to the light emission element of an embodiment of the present disclosure and the display device of an embodiment of the present disclosure. A schematic partial sectional view of a light emission element of the first embodiment is illustrated in FIG. 1. A view of a light trajectory in a schematic partial end view of the light emission element of the first embodiment illustrated in FIG.

Figure 2:
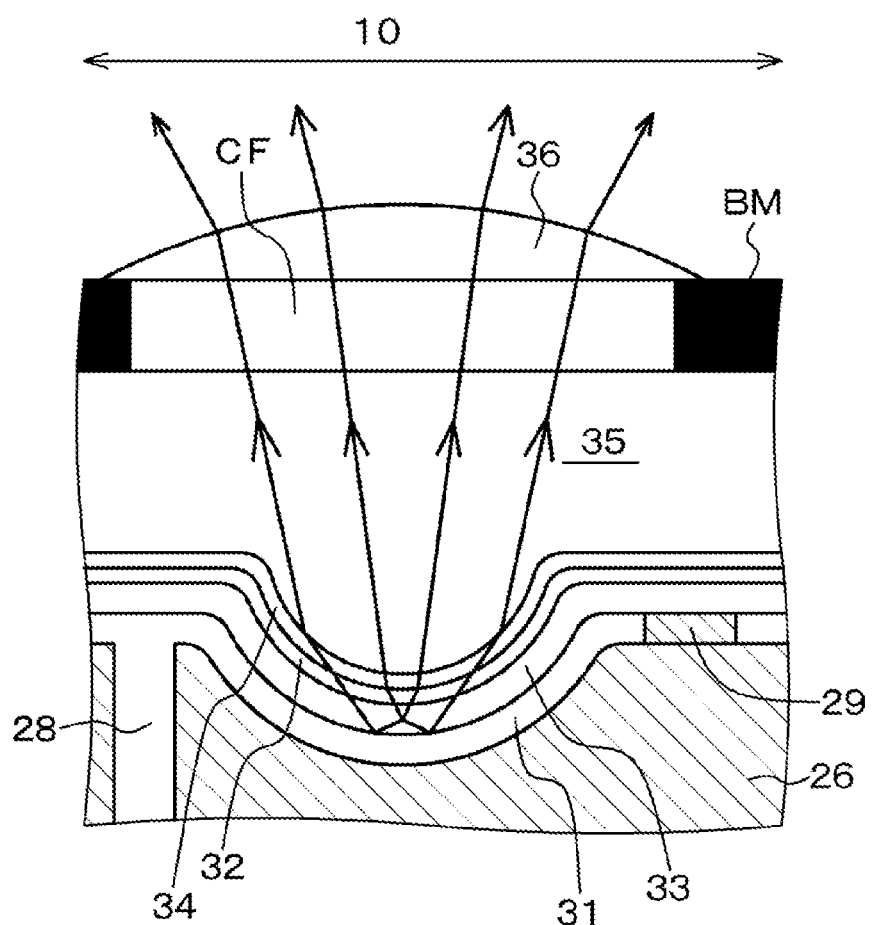
FIG. 2 is a view of a light trajectory in the schematic partial end view of part of the light emission element of the first embodiment illustrated in FIG. 1, except for some hatching lines.
Figure 3:
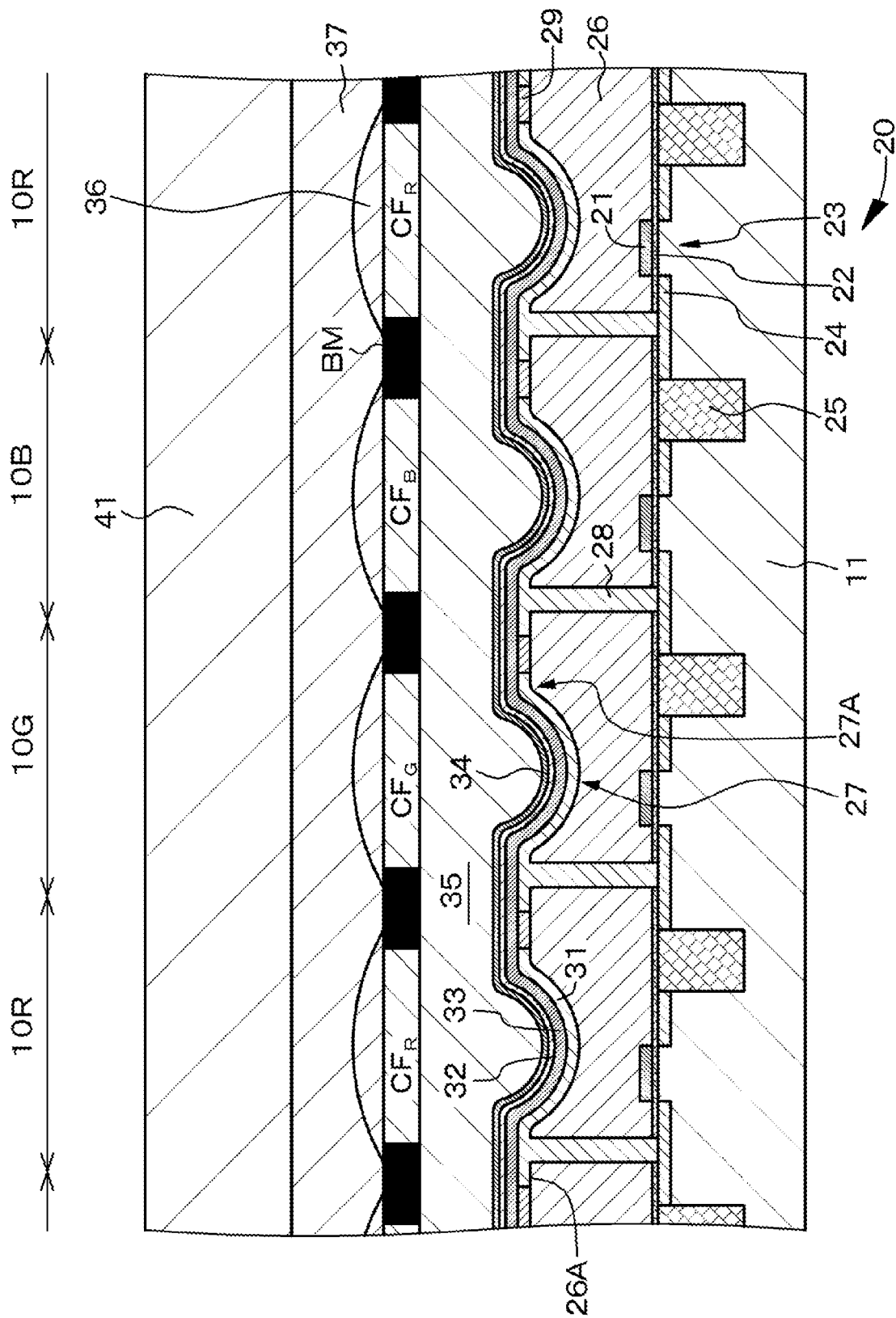
FIG. 3 is a schematic partial sectional view of a display device of the first embodiment.

1 is illustrated in FIG. 2, except for some hatching lines. A schematic partial end view of a display device of the first embodiment is illustrated in FIG. 3. Specifically, the display device of the first embodiment includes an organic EL display device, and specifically, the light emission element of the first embodiment includes an organic EL element. Moreover, the display device of the first embodiment is a top emission (top face emission) display device (a top face emission display device) configured to emit light from a second substrate.

A light emission element 10 (10R, 10G, 10B) of the first embodiment includes at least
- a base 26,
- a recessed portion 27 provided at a surface 26A of the base 26,
- a first electrode layer 31 formed at least partially along the shape of a top surface of the recessed portion 27,
- an organic layer 33 formed on the first electrode layer 31 at least partially along the shape of a top surface of the first electrode layer 31,
- a second electrode layer 32 formed on the organic layer 33 along the shape of a top surface of the organic layer 33, and
- a planarization layer 35 formed on the second electrode layer 32.

Light from the organic layer 33 is emitted to the outside via the second electrode layer 32 and the planarization layer 35.

Moreover, the display device of the first embodiment includes
- a first substrate 11 and a second substrate 41, and multiple light emission elements 10 (10R, 10G, 10B) positioned between the first substrate 11 and the second substrate 41, provided on the base 26 formed on the first substrate 11, and arranged in a two-dimensional manner.

Each light emission element 10 (10R, 10G, 10B) includes at least
- the recessed portion 27 provided at the surface of the base 26,
- the first electrode layer 31 formed at least partially along the shape of the top surface of the recessed portion 27,
- the organic layer 33 formed on the first electrode layer 31 at least partially along the shape of the top surface of the first electrode layer 31,
- the second electrode layer 32 formed on the organic layer 33 along the shape of the top surface of the organic layer 33, and
- the planarization layer 35 formed on the second electrode layer 32.

The light from the organic layer 33 is emitted to the outside via the second electrode layer 32, the planarization layer 35, and the second substrate 41.

In the light emission element of the first embodiment, the entirety of the first electrode layer 31 is, in the recessed portion 27, formed along the shape of the top surface of the recessed portion 27, and the entirety of the organic layer 33 is formed on the first electrode layer 31 along the shape of the top surface of the first electrode layer 31.

In the light emission element 10 of the first embodiment, a protection film 34 is formed between the second electrode layer 32 and the planarization layer 35. The protection film 34 is formed along the shape of a top surface of the second electrode layer 32. When the index of refraction of a material forming the planarization layer 35 is $n_1$ and the index of refraction of a material forming the protection film 34 is $n_2$, $n_1 > n_2$ is satisfied. The value of $(n_1 - n_2)$ can be, but not limited to, 0.1 to 0.6, for example. Specifically, the material forming the planarization layer 35 is a material whose index of refraction is adjusted (increased) by addition of $TiO_2$ to a base material including acrylic-based resin or a material whose index of refraction is adjusted (increased) by addition of $TiO_2$ to a base material including the same type of material (note that a clear and colorless material to which no pigment is added) as a color resist material, and the material forming the protection film 34 includes SiN, SiON, $Al_2O_3$, or $TiO_2$. Note that
$n_1 = 2.0$ and
$n_2 = 1.6$, for example.

With such a protection film 34, part of the light emitted from the organic layer 33 passes, as illustrated in FIG. 2, through the second electrode layer 32 and the protection film 34 to enter the planarization layer 35, and part of the light emitted from the organic layer 33 is reflected on the first electrode layer 31 to enter the planarization layer 35 through the second electrode layer 32 and the protection film 34. As described above, the protection film 34 and the planarization layer 35 can form an internal lens, and as a result, the light emitted from the organic layer 33 can be condensed in a direction toward a center side of the light emission element.

Alternatively, in the light emission element of the first embodiment, $$|\theta_i| > |\theta_r|$$

is satisfied in the case of $|\theta_r| \neq 0$ when the incident angle of the light emitted from the organic layer 33 and entering the planarization layer 35 through the second electrode layer 32 is $\theta_i$ and the angle of refraction of the light having entered the planarization layer 35 is $\theta_r$. When these conditions are satisfied, part of the light emitted from the organic layer 33 passes through the second electrode layer 32 to enter the planarization layer 35, and part of the light emitted from the organic layer 33 is reflected on the first electrode layer 31 to enter the planarization layer 35 through the second electrode layer 32. As a result of formation of the internal lens as described above, the light emitted from the organic layer 33 can be condensed in the direction toward the center side of the light emission element.

If no recessed portion is formed and the first electrode layer, the organic layer, and the second electrode layer form a flat multilayer structure, the light emitted from the organic layer more expands to the outside of the light emission element beyond the light emission element of the first embodiment, and the efficiency of extracting front light is difficult to improve.

Moreover, in the light emission element of the first embodiment, an on-chip microlens 36 including a well-known material is, by a well-known method, provided on or above a top surface of the planarization layer 35 (specifically above the planarization layer 35, and more specifically on later-described color filter layers $CF_R$, $CF_G$, and $CF_B$ formed on the planarization layer 35). When the recessed portion 27 is cut along a virtual plane including the axis AX of the recessed portion 27, the sectional shape of the recessed portion 27 is a smooth curve (specifically an arc). When the recessed portion 27 is cut along the virtual plane, a sectional shape from an edge portion of the recessed portion 27 to the surface of the base 26 is a smooth curve. That is, an edge portion 27A of the recessed portion 27 is rounded. The shape (the planar shape) of the edge portion of the recessed portion 27 is a circular shape or an oval shape, but in the case of the circular shape, a light reflection efficiency at the first electrode layer 31 can be further improved.

The color filter layers $CF_R$, $CF_G$, and $CF_B$ and the on-chip microlens 36 are bonded to the second substrate 41 via a sealing resin layer 37. A material forming the sealing resin layer 37 may include, for example, thermosetting adhesives and ultraviolet curable adhesives such as an acrylic-based adhesive, an epoxy-based adhesive, a urethane-based adhesive, a silicone-based adhesive, and a cyanoacrylate-based adhesive. The color filter layers $CF_R$, $CF_G$, and $CF_B$ are on-chip color filter (OCCF) layers formed on a first substrate side. Moreover, with this configuration, a distance between the organic layer and the color filter layer CF can be shortened, color mixing due to entrance of the light emitted from the organic layer into the adjacent color filter layers CF in other colors can be reduced, and a wide range of lens designing of the on-chip microlens is available.

Figure 14A:
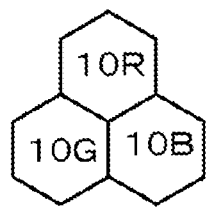
FIGS. 14A, 14B, 14C, and 14D are schematic views of arrangement of the light emission elements in the display device of the first embodiment.
Figure 14B:
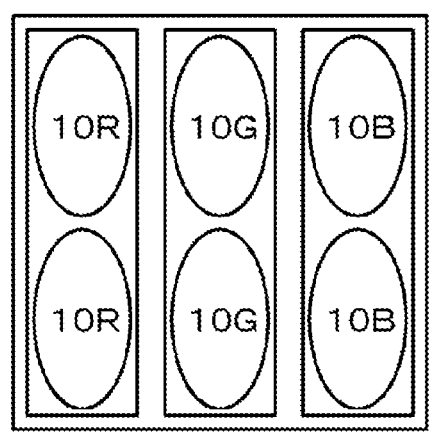
Figure 14C:
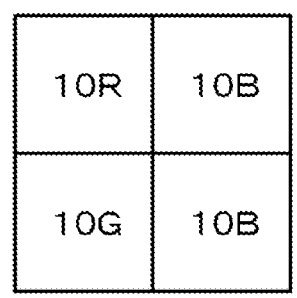
Figure 14D:
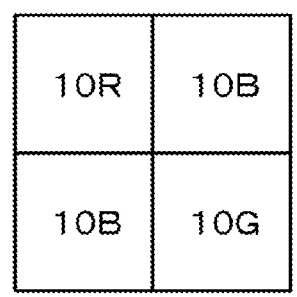

In the light emission element 10 of the first embodiment including the organic EL element, the organic layer 33 has a multilayer structure of a red light emission layer, a green light emission layer, and a blue light emission layer. A single pixel includes three light emission elements of a red light emission element 10R, a green light emission element 10G, and a blue light emission element 10B. The organic layer 33 forming the light emission element 10 is configured to emit white light, and each of the light emission elements 10R, 10G, and 10B includes a combination of the organic layer 33 configured to emit the white light and each of the color filter layers $CF_R$, $CF_G$, and $CF_B$. The red light emission element 10R for displaying in the color of red includes the red color filter layer $CF_R$, the green light emission element 10G for displaying in the color of green includes the green color filter layer $CF_G$, and the blue light emission element 10B for displaying in the color of blue includes the blue color filter layer $CF_B$. The red light emission element 10R, the green light emission element 10G, and the blue light emission element 10B have the same configuration/structure, except for the positions of the color filter layer and the light emission layer. Moreover, a black matrix layer BM is provided between the color filter layer CF and the color filter layer CF. The black matrix layer BM includes, for example, a black resin film (specifically black polyimide resin, for example) mixed with a black colorant and having an optical density of equal to or greater than 1. For example, the number of pixels is 1920×1080, a single light emission element (a single display element) includes a single sub-pixel, and the light emission elements (specifically the organic EL elements) are three times as many as the number of pixels. In the display device of the first embodiment, delta arrangement illustrated in FIG. 14A can be employed as sub-pixel arrangement. Note that, for example, stripe arrangement as illustrated in FIGS. 14B, 14C, and 14D can be employed. In some cases, the red light emission element, the green light emission element, the blue light emission element, and the light emission element configured to emit the white light (or a light emission element configured to emit light in a complementary color) may form a single pixel.

Figure 15A:
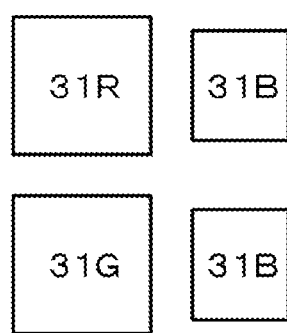
FIGS. 15A, 15B, 15C, and 15D are schematic views of an arrangement relationship of a second electrode and a color filter layer in the display device of the first embodiment.
Figure 15B:
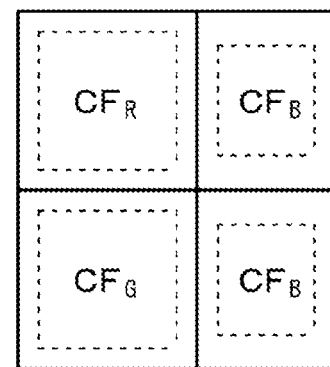

FIGS. 15A, 15B, 15C, and 15D schematically illustrate an arrangement relationship among first electrodes 31R, 31G, and 31B and the color filter layers $CF_R$, $CF_G$, and $CF_B$. Note that in FIGS. 15B and 15D, the color filter layers $CF_R$, $CF_G$, and $CF_B$ are indicated by dashed lines. Specifically, for an eye swing (attention to a viewing angle and coloring) purpose as in an electronic view finder, the sizes of the color filter layers $CF_R$, $CF_G$, and $CF_B$ in the red light emission element, the green light emission element, and the blue light emission element and the sizes of the first electrodes 31R, 31G, and 31B are adjusted. Specifically, as illustrated in FIGS. 15A and 15B, adjustment is made to satisfy (Width of First Electrode of Read Light Emission Element)=(Width of First Electrode of Green Light Emission Element)>(Width of First Electrode of Blue Light Emission Element).

Figure 15C:
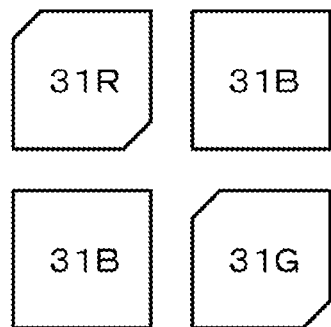
Figure 15D:
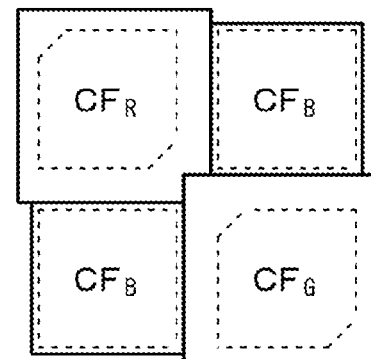
Figure 16A:
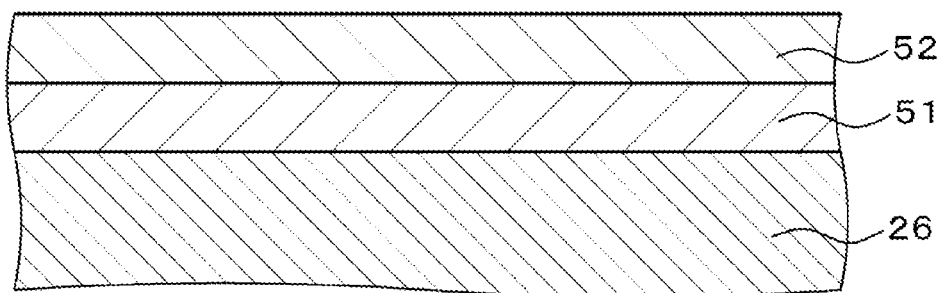
FIGS. 16A, 16B, and 16C are schematic partial end views of a base etc. for describing the method for manufacturing the light emission element of the first embodiment illustrated in FIG. 1.
Figure 16B:
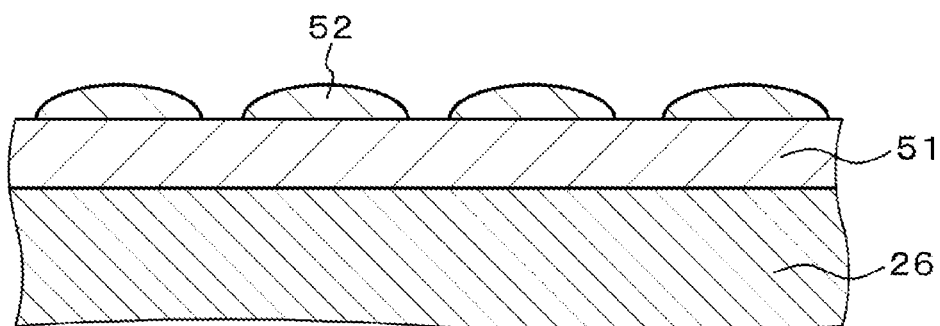
Figure 16C:
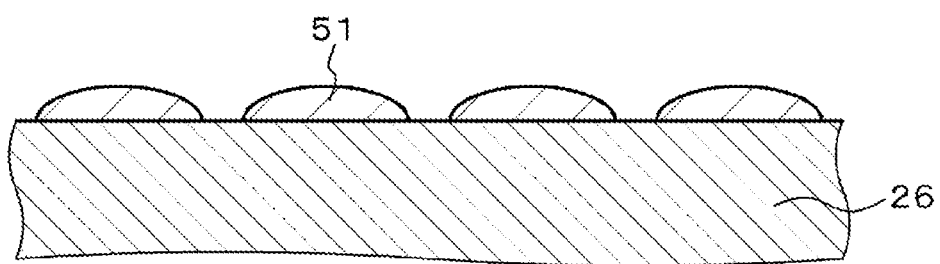
Figure 17A:
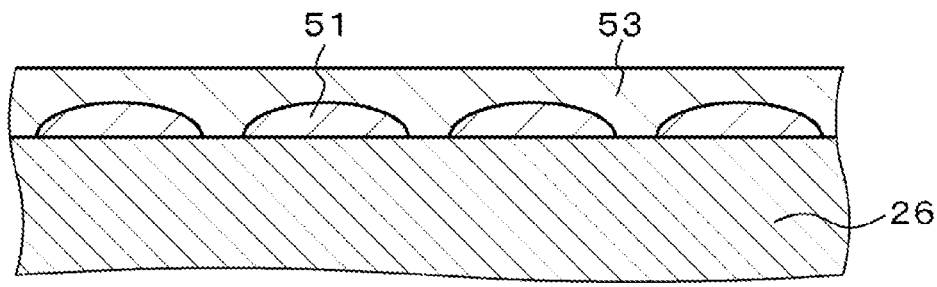
FIGS. 17A and 17B are schematic partial end views of the base etc. for describing, continuously from FIG. 16C, the method for manufacturing the light emission element of the first embodiment illustrated in FIG. 1.
Figure 17B:
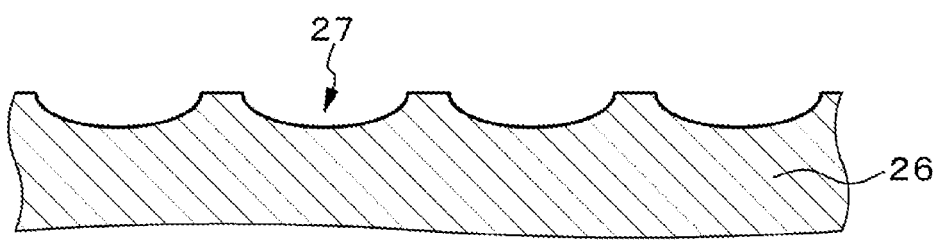

In this manner, the substantially same level of color intensity is provided using, as parameters, the viewing angles of the red light emission element, the green light emission element, and the blue light emission element including the light emission elements having the organic layer 33 configured to emit the white light, and coloring due to the viewing angle can be avoided. Alternatively, in a case where two blue light emission elements are diagonally arranged and the red light emission element and the green light emission element are diagonally arranged as illustrated in FIGS. 15C and 15D, opposing portions of the first electrode 31R forming the red light emission element and the first electrode 31G forming the green light emission element are preferably cut out. Further, for holding viewing angle symmetry in association with an azimuth angle, a portion of the first electrode 31R facing the cutout portion of the first electrode 31R of the red light emission element is more preferably cut out, and a portion of the first electrode 31G facing the cutout portion of the first electrode 31G of the green light emission element is more preferably cut out.

A light emission element drive portion is provided below the base (interlayer insulating layer) 26 including $SiO_2$ on the basis of a CVD method. The light emission element drive portion may have a well-known circuit configuration. The light emission element drive portion includes a transistor (specifically a MOSFET) formed on a silicon semiconductor substrate equivalent to the first substrate 11. A transistor 20 including a MOSFET includes a gate insulating layer 22 formed on the first substrate 11, gate electrodes 21 formed on the gate insulating layer 22, source/drain regions 24 formed on the first substrate 11, a channel formation region 23 formed between adjacent ones of the source/drain regions 24, and an element isolation region 25 surrounding the channel formation region 23 and the source/drain regions 24. The transistor 20 and the first electrode layer 31 are electrically connected to each other via a contact plug 28 provided at the base 26. Note that in the figure, a single transistor 20 is illustrated for a single light emission element drive portion.

The second electrode layer 32 is connected to the light emission element drive portion via a not-shown contact hole (the contact plug) formed at the base (the interlayer insulating layer) 26 at an outer peripheral portion of the display device. At the outer peripheral portion of the display device, an auxiliary electrode connected to the second electrode layer 32 may be provided below the second electrode layer 32, and may be connected to the light emission element drive portion.

The first electrode layer 31 functions as an anode electrode, and the second electrode layer 32 functions as a cathode electrode. The first electrode layer 31 includes a light reflective material layer, and specifically includes a multiplayer structure of an Al—Nd alloy layer, an Al—Cu alloy layer, an Al—Ti alloy layer, and an ITO layer. The second electrode layer 32 includes a transparent conductive material such as ITO. The first electrode layer 31 formed by the light reflective material layer is formed on a slope surface of the recessed portion 27, and therefore, reflectance variation easily caused in a reflector formed by an oxide film in a typical light emission element can be reduced. The first electrode layer 31 is formed on the basis of a combination of a vacuum deposition method and an etching method. Moreover, the second electrode layer 32 is formed by a film formation method with low film-forming particle energy, such as the vacuum deposition method, and is not patterned.

The organic layer 33 is not patterned either. Note that the present disclosure is not limited to above, and the organic layer 33 may be patterned. That is, it may be configured such that each sub-pixel is separately coated with the organic layer 33, the organic layer 33 of the red light emission element includes an organic layer configured to emit red light, the organic layer 33 of the green light emission element includes an organic layer configured to emit green light, and the organic layer 33 of the blue light emission element includes an organic layer configured to emit blue light.

In the first embodiment, the organic layer 33 has a multilayer structure of a hole injection layer (HIL), a hole transport layer (HTL), a light emission layer, an electron transport layer (ETL), and an electron injection layer (EIL). The light emission layer includes at least two light emission layers configured to emit light in different colors, and as described above, the light emitted from the organic layer 33 is the white light. Specifically, the organic layer has such a structure that three layers of a red light emission layer configured to emit red light, a green light emission layer configured to emit green light, and a blue light emission layer configured to emit blue light are stacked on each other. The organic layer may have such a structure that two layers of the blue light emission layer configured to emit the blue light and a yellow light emission layer configured to emit yellow light are stacked on each other, or may have such a structure that two layers of the blue light emission layer configured to emit the blue light and an orange light emission layer configured to emit orange light are stacked on each other.

The hole injection layer is a layer for enhancing a hole injection efficiency. In addition, the hole injection layer functions as a buffer layer configured to prevent leakage, and has a thickness of about 2 nm to 10 nm, for example. For example, the hole injection layer includes a hexaazatriphenylene derivative represented by the following formula (A) or formula (B). Note that when a state in which an end surface of the hole injection layer contacts the second electrode layer is brought, such a state is a main cause for luminance variation among the pixels, leading to lowering of display quality.

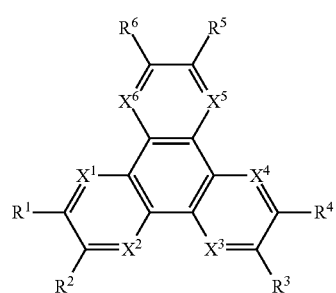

(A)

where $R^1$ to $R^6$ are each independently substituted groups selected from hydrogen, halogen, a hydroxyl group, an amino group, an arylamino group, a substituted or non-substituted carbonyl group with a carbon number of equal to or less than 20, a substituted or non-substituted carbonyl ester group with a carbon number of equal to or less than 20, a substituted or non-substituted alkyl group with a carbon number of equal to or less than 20, a substituted or non-substituted alkenyl group with a carbon number of equal to or less than 20, a substituted or non-substituted alkoxy group with a carbon number of equal to or less than 20, a substituted or non-substituted aryl group with a carbon number of equal to or less than 30, a substituted or non-substituted heterocyclic group with a carbon number of equal to or less than 30, a nitrile group, a cyano group, a nitro group, or a silyl group. Adjacent $R^m$ (m=1 to 6) may be bonded to each other via a cyclic structure. Moreover, $X^1$ to $X^6$ are each independently carbon or nitrogen atoms.

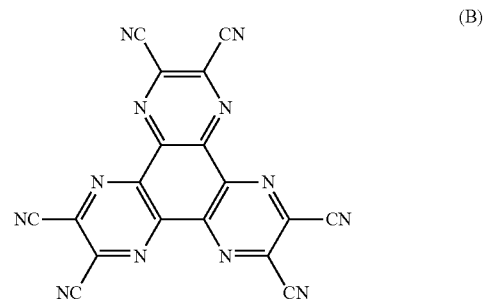 [SMILES: N#Cc1nc2c3nc(C#N)c(C#N)nc3c3nc(C#N)c(C#N)nc3c2nc1C#N]

(B)

The hole transport layer is a layer for enhancing the efficiency of hole transport to the light emission layer. When an electric field is applied, re-bonding of an electron and a hole occurs in the light emission layer, and therefore, light is generated. The electron transport layer is a layer for enhancing the efficiency of electron transport to the light emission layer, and the electron injection layer is a layer for enhancing the efficiency of electron injection to the light emission layer.

The hole transport layer includes, for example, 4,4',4'''-tris(3-methylphenylphenylamino) triphenylamine (m-MTDATA) or α-naphthylphenyldiamine (αNPD) with a thickness of about 40 nm.

The light emission layer is a light emission layer configured to emit white light by color mixing, and for example, includes the stack of the red light emission layer, the green light emission layer, and the blue light emission layer as described above.

By application of the electric field, some of holes injected from the first electrode layer 31 and some of electrons injected from the second electrode layer 32 are re-bonded in the red light emission layer, and the red light is generated. Such a red light emission layer includes, for example, at least one of a red light emission material, a hole transport material, an electron transport material, or both charge transport materials. The red light emission material may be a fluorescent material or a phosphorescence material. The red light emission layer with a thickness of about 5 nm is, for example, formed in such a manner that 30% by mass of 2,6-bis[(4'-methoxydiphenylamino) styryl]-1,5-dicyanonaphthalene (BSN) is mixed with 4, 4-bis (2,2-diphenylvinyl) biphenyl (DPVBi).

By application of the electric field, some of the holes injected from the first electrode layer 31 and some of the electrons injected from the second electrode layer 32 are re-bonded in the green light emission layer, and the green light is generated. Such a green light emission layer includes, for example, at least one of a green light emission material, a hole transport material, an electron transport material, or both charge transport materials. The green light emission material may be a fluorescent material or a phosphorescence material. The green light emission layer with a thickness of about 10 nm is, for example, formed in such a manner that 5% by mass of coumarin 6 is mixed with DPVBi.

By application of the electric field, some of the holes injected from the first electrode layer 31 and some of the electrons injected from the second electrode layer 32 are re-bonded in the blue light emission layer, and the blue light is generated. Such a blue light emission layer includes, for example, at least one of a blue light emission material, a hole transport material, an electron transport material, or both charge transport materials. The blue light emission material may be a fluorescent material or a phosphorescence material. The blue light emission layer with a thickness of about 30 nm is, for example, formed in such a manner that 2.5% by mass of 4,4'-bis[2-{4-(N, N-diphenylamino) phenyl}vinyl] biphenyl (DPAVBi) is mixed with DPVBi.

The electron transport layer with a thickness of about 20 nm includes, for example, 8-hydroxyquinolinealuminum (Alq3). The electron injection layer with a thickness of about 0.3 nm includes, for example, LiF, $Li_2O$, or the like.

Note that the material forming each layer has been described by way of example, and the present disclosure is not limited to these materials. Alternatively, the light emission layer may include, for example, the blue light emission layer and the yellow light emission layer, or may include the blue light emission layer and the orange light emission layer.

The light emission element has a resonator structure in which the organic layer 33 serves as a resonator. For properly adjusting a distance (specifically a distance from a light emission surface to the first electrode layer 31 and the second electrode layer 32) from the light emission surface to a reflection surface, the thickness of the organic layer 33 is preferably equal to or greater than $8\times10^{-8}$ m and equal to or less than $5\times10^{-7}$ m, and more preferably equal to or greater than $1.5\times10^{-7}$ m and equal to or less than $3.5\times10^{-7}$ m. In the organic EL display device having the resonator structure, the red light emission element 10R actually resonates the red light emitted from the light emission layer, thereby emitting light (light having a peak of an optical spectrum in a red range) with redness from the second electrode layer 32. Moreover, the green light emission element 10G resonates the green light emitted from the light emission layer, thereby emitting light (light having the peak of the optical spectrum in a green range) with greenness from the second electrode layer 32. Further, the blue light emission element 10B resonates the blue light emitted from the light emission layer, thereby emitting light (light having the peak of the optical spectrum in a blue range) with blueness from the second electrode layer 32.

Hereinafter, the outline of the method for manufacturing the light emission element of the first embodiment as illustrated in FIG. 1 will be described with reference to FIGS. 16A, 16B, 16C, 17A, 17B, 18A, and 18B as schematic partial end views of the base etc.

Step-100

First, the light emission element drive portion is formed on the silicon semiconductor substrate (the first substrate 11) on the basis of a well-known MOSFET manufacturing process.

Step-110

Subsequently, the base (the interlayer insulating layer) 26 is formed across an entire surface on the basis of the CVD method.

Step-120

Next, each recessed portion 27 is formed at a portion of the base 26 where the light emission element needs to be formed. Specifically, a mask layer 51 including SiN is formed on the base 26 including $SiO_2$, and a resist layer 52 with a shape for forming the recessed portions is formed on the mask layer 51 (see FIGS. 16A and 16B). Then, the resist layer 52 and the mask layer 51 are etched back, and in this manner, the shape formed at the resist layer 52 is transferred to the mask layer 51 (see FIG. 16C). Subsequently, after a resist layer 53 has been formed across the entire surface (see FIG. 17A), the resist layer 53, the mask layer 51, and the base 26 are etched back, and in this manner, the recessed portions 27 can be formed at the base 26 (see FIG. 17B). A material of the resist layer 53 is selected as necessary, and etching conditions for etching back the resist layer 53, the mask layer 51, and the base 26 are properly set. Specifically, a material system and the etching conditions are selected such that the etching speed of the resist layer 53 is slower than that of the mask layer 51. In this manner, the recessed portions 27 can be formed at the base 26.

Figure 18A:
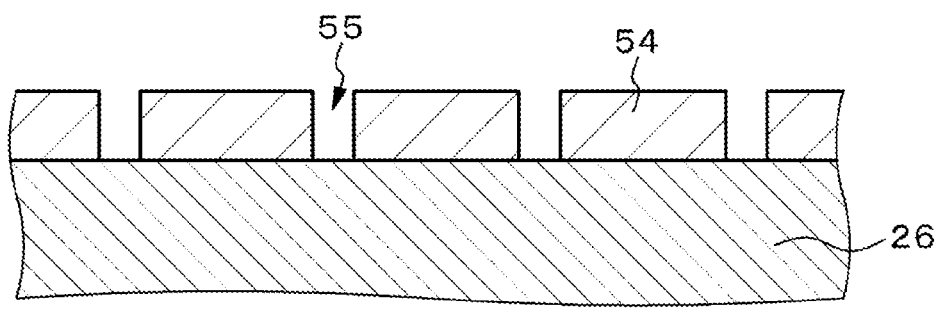
FIGS. 18A and 18B are schematic partial end views of the base etc. for describing another method for manufacturing the light emission element of the first embodiment illustrated in FIG. 1.
Figure 18B:
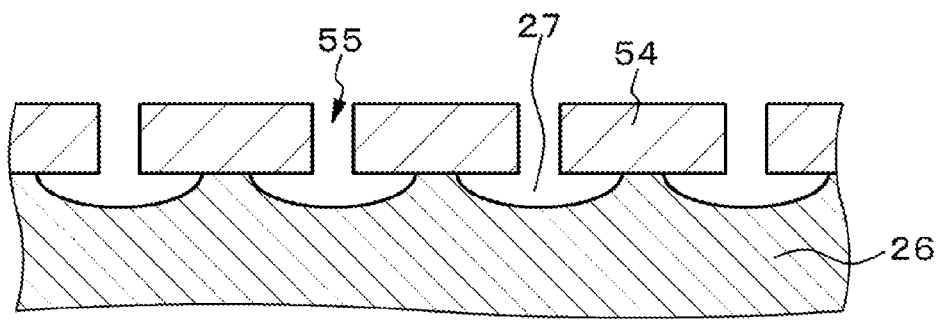

Alternatively, a resist layer 54 with openings 55 is formed on the base 26 (see FIG. 18A). Then, the base 26 is wet-etched via the openings 55, and in this manner, the recessed portions 27 can be formed at the base 26 (see FIG. 18B).

Step-130

Thereafter, a connection hole is formed at a portion of the base 26 positioned above one source/drain region of the transistor 20 on the basis of a photolithography technique and an etching technique. Then, a metal layer is formed on the base 26 including the recessed portions 27 and the connection hole on the basis of, e.g., a sputtering method. Subsequently, the metal layer is patterned on the basis of the photolithography technique and the etching technique, and in this manner, the first electrode layer 31 can be formed on part of the base 26 including the inside of the recessed portions 27. The first electrode layer 31 is isolated for each light emission element. Moreover, the first electrode layer 31 is formed along the shape of the top surface of the recessed portion 27, and has the same thickness in the recessed portion 27. In addition, the contact hole (contact plug) 28 configured to electrically connect the first electrode layer 31 and the transistor 20 can be formed in the connection hole.

Step-140

Next, after an insulating layer 29 has been formed across the entire surface on the basis of, e.g., the CVD method, the insulating layer 29 remains on the base 26 between the first electrode layer 31 and the first substrate 11 on the basis of the lithography technique and the etching technique.

Step-150

Thereafter, the organic layer 33 is formed on the first electrode layer 31 and the insulating layer 29 by a PVD method such as the vacuum deposition method or the sputtering method, for example, a coating method such as a spin coat method or a die coat method, etc. In some cases, the organic layer 33 may be patterned in a desired shape. The organic layer 33 is formed on the first electrode layer 31 along the shape of the top surface of the first electrode layer 31, and has the same thickness in the recessed portion 27.

Step-160

Subsequently, the second electrode layer 32 is formed across the entire surface on the basis of the vacuum deposition method or the like. In some cases, the second electrode layer 32 may be patterned into a desired shape. In this manner, the organic layer 33 and the second electrode layer 32 can be formed on the first electrode layer 31. The second electrode layer 32 is formed on the organic layer 33 along the shape of the top surface of the organic layer 33, and has the same thickness in the recessed portion 27.

Step-170

Thereafter, the protection film 34 is formed across the entire surface on the basis of, e.g., an ALD method. The protection film 34 is formed on the second electrode layer 32 along the shape of the top surface of the second electrode layer 32, and has the same thickness in the recessed portion 27. Subsequently, after the planarization layer 35 has been formed across the entire surface on the basis of a coating method, planarization processing is performed for the top surface of the planarization layer 35. Since the planarization layer 35 can be formed on the basis of the coating method, there are less limitations on a forming process, a material selection range is broader, and use of a high refractive index material is allowed. Thereafter, the color filter layers $CF_R$, $CF_G$, and $CF_B$ and the black matrix layer BM are formed on the planarization layer 35 by a well-known method, and the on-chip microlens 36 is further formed on each of the color filter layers $CF_R$, $CF_G$, and $CF_B$. Then, the color filter layers $CF_R$, $CF_G$, and $CF_B$ and the on-chip microlenses 36 are bonded to the second substrate 41 with the sealing resin layer 37 including the acrylic-based adhesive. In this manner, the organic EL display device illustrated in FIG. 3 can be obtained. As described above, a so-called OCCF type is employed such that the color filter layers CF are not provided on a second substrate side but on the first substrate side. Thus, the distance between the organic layer 33 and the color filter layer CF can be shortened, and the designed width of the on-chip microlens 36 and the degree of freedom in designing of the on-chip microlens 36 can be increased. In addition, with the on-chip microlens 36, not only color mixing between adjacent pixels can be prevented, but also light can be released as necessary according to a necessary viewing angle. In addition, the so-called OCCF type is employed, and therefore, no problem is caused in position adjustment relative to the organic layer 33.

Simulation on how light condensing characteristics change according to the shape of the recessed portion 27 has been conducted. Specifically, the light condensing characteristics, i.e., the peak intensity of the light emitted from the light emission element, in the light emission element having the flat multilayer structure of the first electrode layer, the organic layer, and the second electrode layer with no recessed portions were a reference value of "1.00". Moreover, it was assumed that in the light emission element of the first embodiment, the shape of an orthogonal projection image of the recessed portion 27 when the recessed portion 27 is orthogonally projected on the base virtual plane is a circular shape with a diameter of 4 μm and light is generated in a circular region with a diameter of 1.8 μm at a bottom portion of the recessed portion 27. Then, first, simulation was conducted assuming that an air layer is present in and above the recessed portion 27. In this case, the depth of the recessed portion 27 was 1.0 μm (Condition-1), 1.5 μm (Condition-2), and 2.0 μm (Condition-3). The light condensing characteristics of the light emission element, i.e., the value (the relative peak intensity) of the peak intensity of the light emitted from the light emission element, under each condition is shown in Table 1 below.

Next, simulation was conducted assuming that the same structure as that of the light emission element of the first embodiment is employed, the shape of the orthogonal projection image of the recessed portion 27 when the recessed portion 27 is orthogonally projected on the base virtual plane is a circular shape with a diameter of 4 μm, the index $n_1$ of refraction of the planarization layer 35 is 2.00, and the index $n_2$ of refraction of the protection film 34 is 1.50. Here, under Condition-4, the depth of the recessed portion 27 was 1.5 μm, and the diameter of the planarization layer in the base virtual plane was 3.0 μm. Under Condition-5, the depth of the recessed portion 27 was 1.5 μm, and the diameter of the planarization layer in the base virtual plane was 2.0 μm. The light condensing characteristics of the light emission element, i.e., the value (the relative peak intensity) of the peak intensity of the light emitted from the light emission element, under each condition is shown in Table 1 below.

TABLE 1

|  | $D_p/R$ | Relative Peak Intensity |
| --- | --- | --- |
| Condition-1 | 0.25 | 1.46 |
| Condition-2 | 0.38 | 2.34 |
| Condition-3 | 0.50 | 1.75 |
| Condition-4 | 0.25 | 1.14 |
| Condition-5 | 0.25 | 3.50 |

With the recessed portion 27, it can be confirmed that front luminance is up to 2.3 times as high as that of the typical light emission element having the flat multilayer structure under Condition-1 to Condition-3.

Basically, the size of the recessed portion 27 depends on a pixel pitch. Thus, even when the pixel pitch changes, if such a ratio (Dp/R) is held, similar advantageous effects might be obtained. Further, with the structure of the light emission element of the first embodiment, it can be confirmed that the light condensing characteristics are improved by 3.5 times (see Condition-5).

In the light emission element of the first embodiment, the recessed portions are provided at the surface of the base, and the first electrode layer, the organic layer, and the second electrode layer are substantially formed along the shape of the top surface of each recessed portion. In addition, with these recessed portions, the recessed portions can function as one type of concave mirror. As a result, the efficiency of extracting the front light can be improved, and a current-light emission efficiency can be significantly improved. In addition, manufacturing steps are not significantly increased. Moreover, the thickness of the organic layer is a constant thickness, and therefore, a resonator structure can be easily formed. Further, the thickness of the first electrode layer is a constant thickness, and therefore, occurrence of phenomena such as coloring and a luminance change of the first electrode layer depending on the angle of viewing the display device due to a change in the thickness of the first electrode layer can be reduced.

Note that in FIG. 1 etc., other regions than the recessed portions 27 are formed by the multilayer structure of the first electrode layer 31, the organic layer 33, and the second electrode layer 32, and therefore, light is also emitted from these regions. Thus, there is a probability that lowering of a light condensing efficiency and lowering of monochromatic chromaticity due to light leakage from adjacent pixels occur. In this case, a boundary between the insulating layer 29 and the first electrode layer 31 is a light emission area end, and therefore, the region emitting the light may be optimized by optimization of such a boundary.

Specifically, in a microdisplay with a small pixel pitch, even when a recessed portion depth is decreased and an organic layer is formed in a recessed portion, a high front light extraction efficiency can be realized. This is suitable for future mobile applications. Simulation results for the first embodiment show that the current-light emission efficiency is improved by 3.5 times as high as that of the typical light emission element. Thus, the lives of the light emission element and the display device can be extended, and the luminance of the light emission element and the display device can be enhanced. Moreover, applications to eyewear, an augmented reality (AR) glass, and EVR are significantly expanded.

The greater recessed portion depth, the more light emitted from the organic layer and reflected on the first electrode layer can be condensed in the direction toward the center side of the light emission element. However, in the case of a great recessed portion depth, it might be difficult to form the organic layer above the recessed portions. However, the protection film and the planarization layer form the internal lens, and therefore, the light reflected on the first electrode layer can be condensed in the direction toward the center side of the light emission element even when the depth of the recessed portion is small. Thus, the front light extraction efficiency can be further improved. In addition, the internal lens is formed in a self-aligned manner with respect to the organic layer, and therefore, there is no variation in position adjustment between the organic layer and the internal lens. Moreover, formation of the recessed portions and the internal lens can increase the angle of the light passing through the color filter layer with respect to the base virtual plane, and therefore, occurrence of color mixing between adjacent pixels can be effectively prevented. In addition, this improves color gamut degradation due to optical color mixing between adjacent pixels, and therefore, the color gamut of the display device can be improved. In addition, typically, the closer a light emission layer and a lens are to each other, the wider angle light can be efficiently expanded to. A distance between the internal lens and the light emission layer is extremely short, and therefore, the designed width of the light emission element and the degree of freedom in designing of the light emission element can be increased. In addition, the thickness or material of the protection film is properly selected so that the distance between the internal lens and the light emission layer or the curvature of the internal lens can be changed, and the designed width of the light emission element and the degree of freedom in designing of the light emission element can be further increased. Further, thermal processing is unnecessary for formation of the internal lens, and therefore, no damage is caused in the organic layer.

Figure 4:
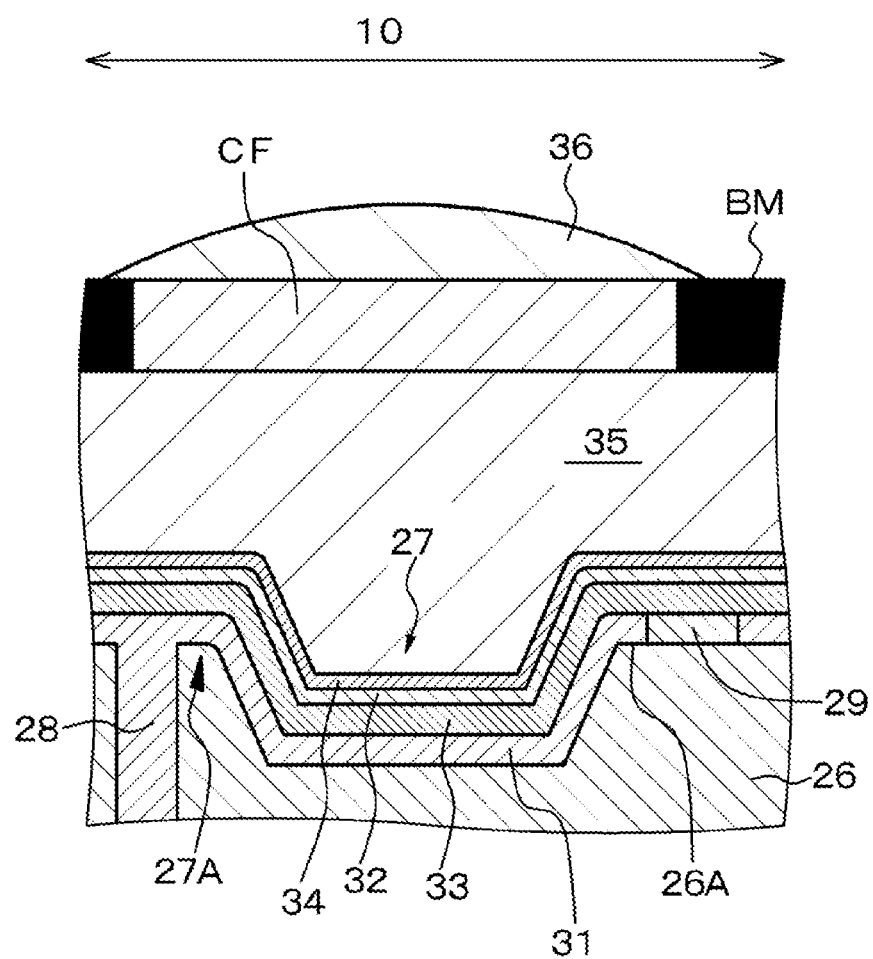
FIG. 4 is a schematic partial end view of a variation of the light emission element of the first embodiment.
Figure 5:
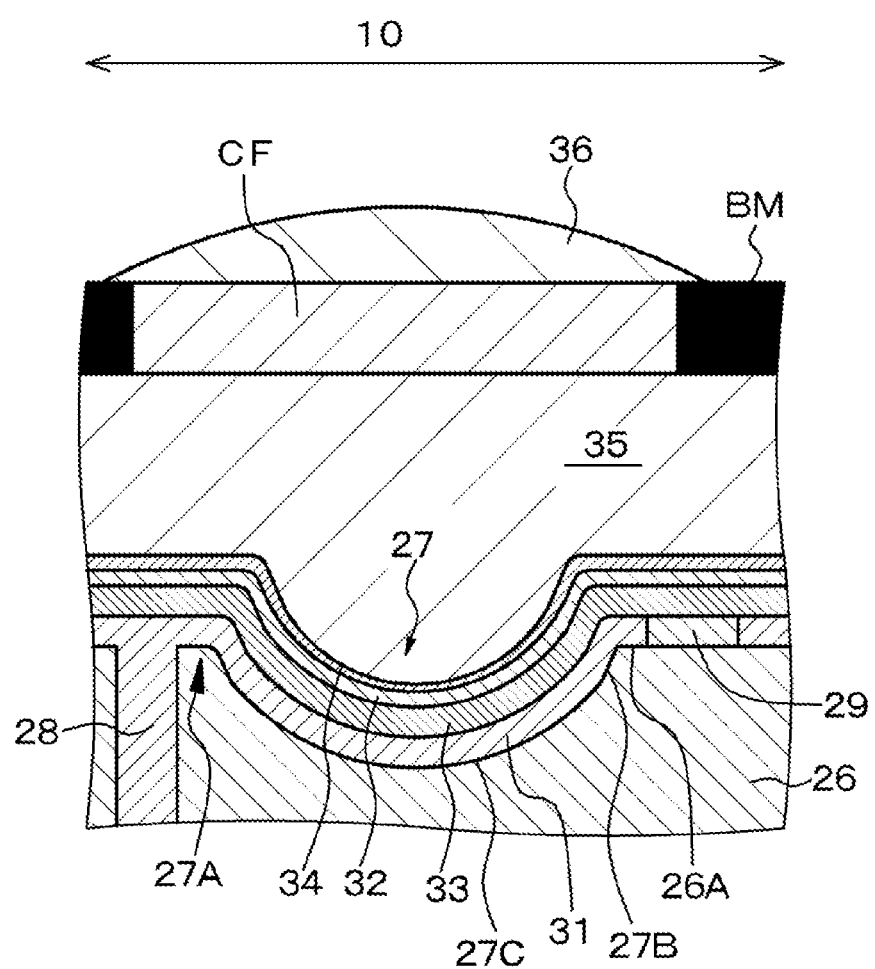
FIG. 5 is a schematic partial end view of another variation of the light emission element of the first embodiment.

In an example illustrated in FIG. 1, the sectional shape of the recessed portion 27 when the recessed portion 27 is cut along the virtual plane including the axis AX of the recessed portion 27 is the smooth curve. However, the sectional shape may be part of a trapezoidal shape as illustrated in FIG. 4, or may be a combination of a linear inclined surface 27B and a bottom portion 27C defining a smooth curve as illustrated in FIG. 5. Since the sectional shape of the recessed portion 27 is any of these shapes, the angle of inclination of the inclined surface 27B can be increased. As a result, even in a shape in which the depth of the recessed portion 27 is small, extraction of the light emitted from the organic layer 33 and reflected on the first electrode layer 31 in a forward direction can be improved.

Second Embodiment

Figure 6:
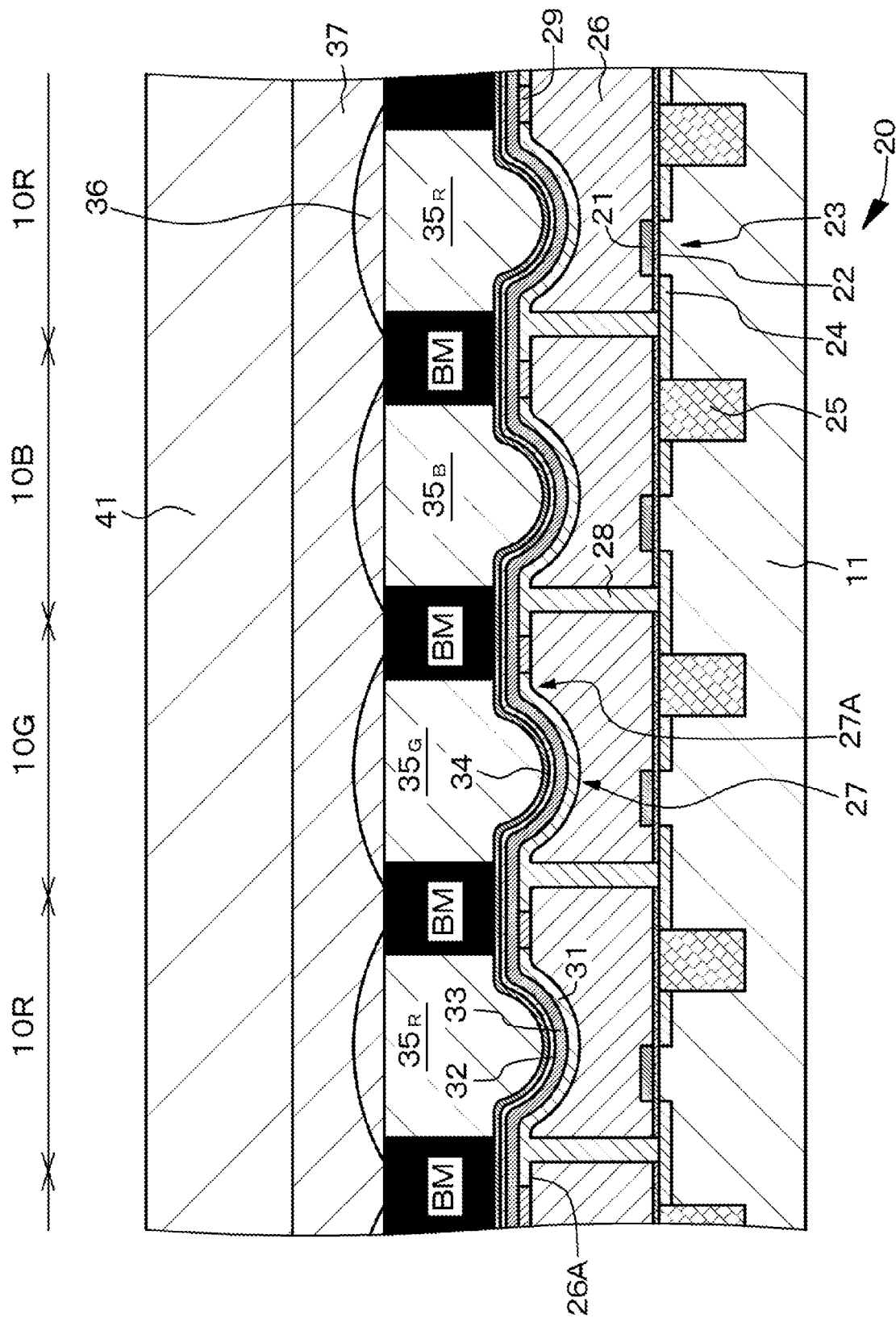
FIG. 6 is a schematic partial end view of a light emission element of a second embodiment.

A second embodiment is a variation of the first embodiment. In the first embodiment, the color filter layers $CF_R$, $CF_G$, and $CF_B$ are formed on the planarization layer 35. On the other hand, in a light emission element of the second embodiment, a planarization layer 35 ($35_R$, $35_G$, $35_B$) has a function as a color filter as illustrated in FIG. 6 as a schematic partial end view. Formation of the color filter layers $CF_R$, $CF_G$, and $CF_B$ can be omitted. The planarization layer 35 having the function of the color filter includes a well-known color resist material. Thus, a structure for both of light condensation and color separation can be provided. Moreover, the planarization layer 35 functioning as the color filter and an organic layer 33 are close to each other, and therefore, color mixing can be effectively prevented even with a wider angle of light emitted from the light emission element. Consequently, viewing angle characteristics are improved. Other configurations/structures of the light emission element of the second embodiment than the above-described points can be similar to those of the light emission element of the first embodiment, and therefore, detailed description will be omitted.

Third Embodiment

Figure 7:
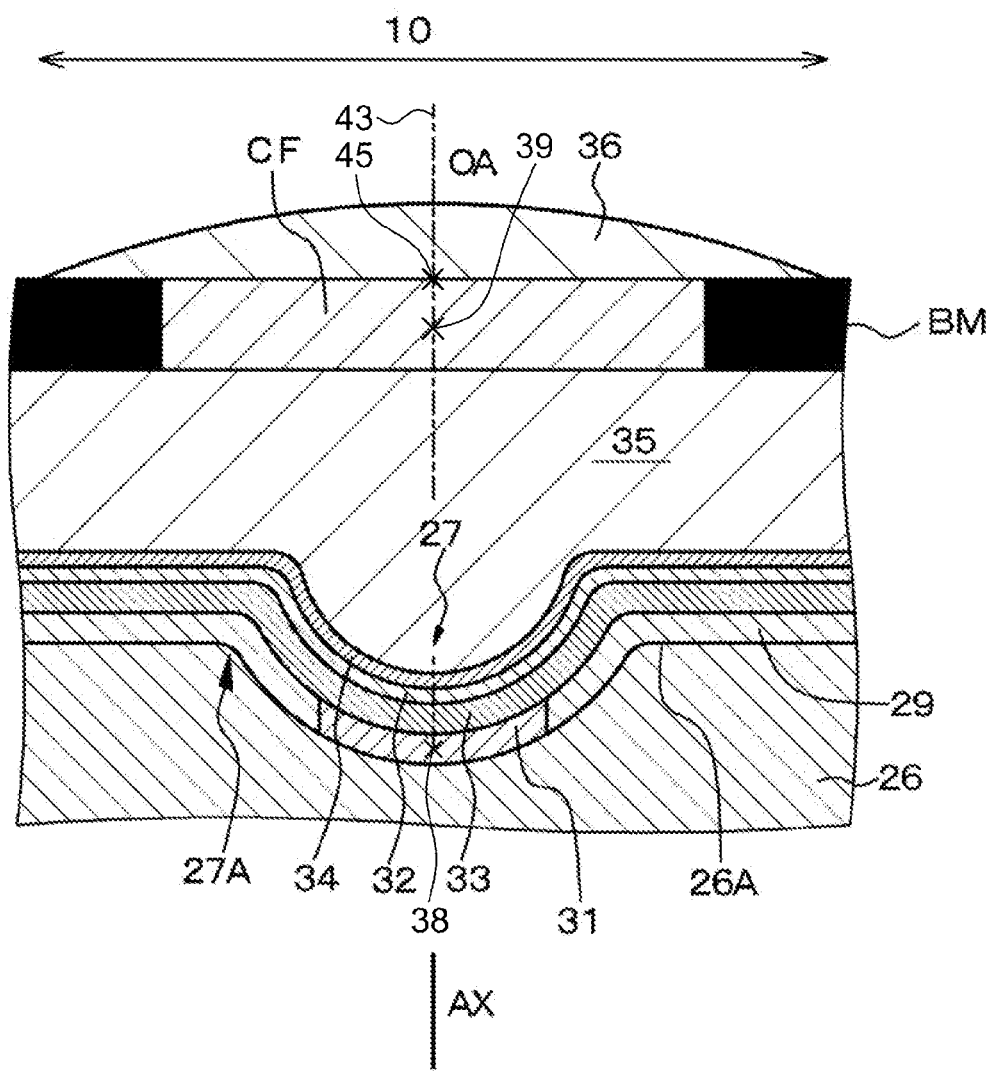
FIG. 7 is a schematic partial end view of a light emission element in a display device of a third embodiment.
Figure 8:
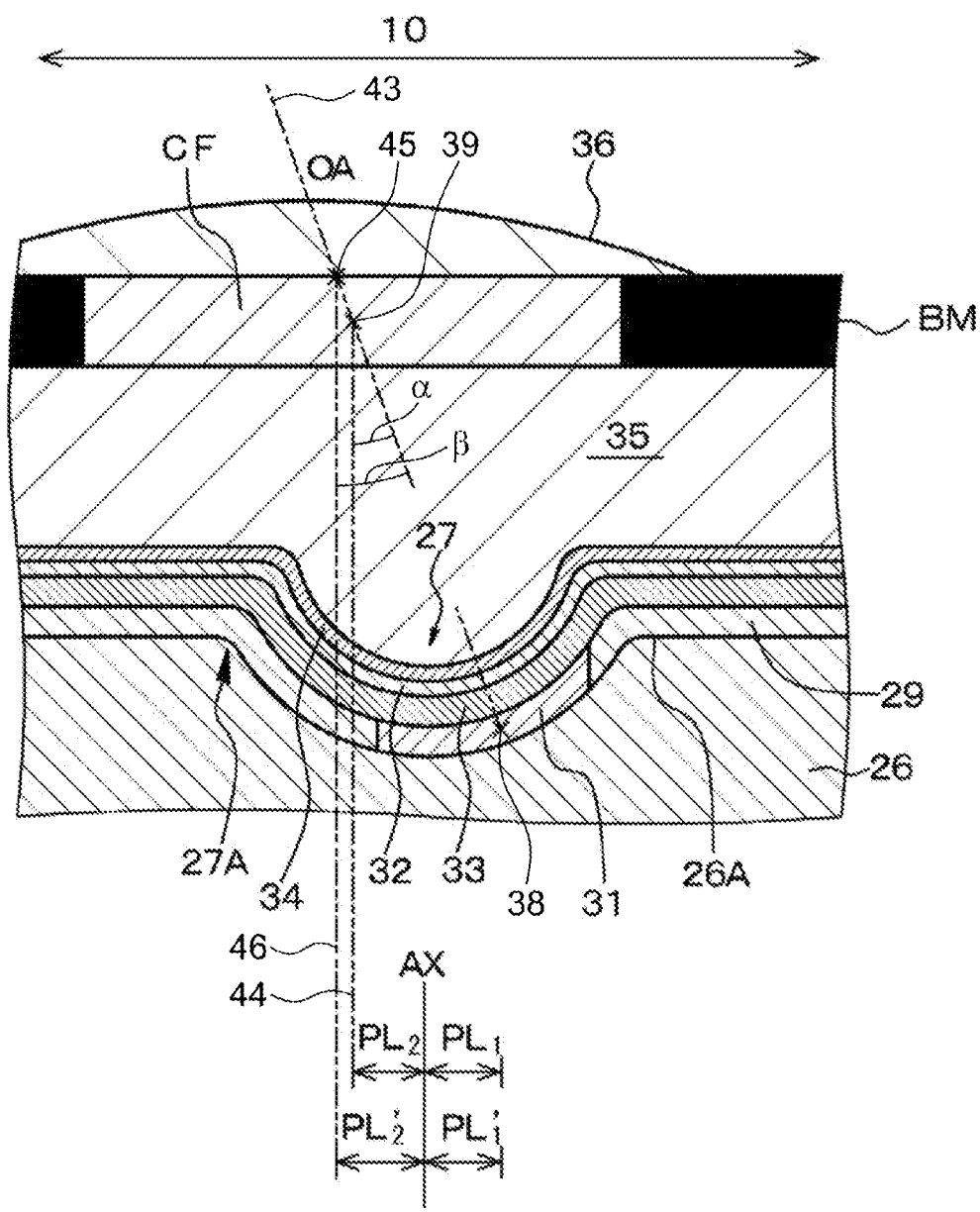
FIG. 8 is a schematic partial end view of a light emission element at a position different from that of FIG. 7 in the display device of the third embodiment.
Figure 9:
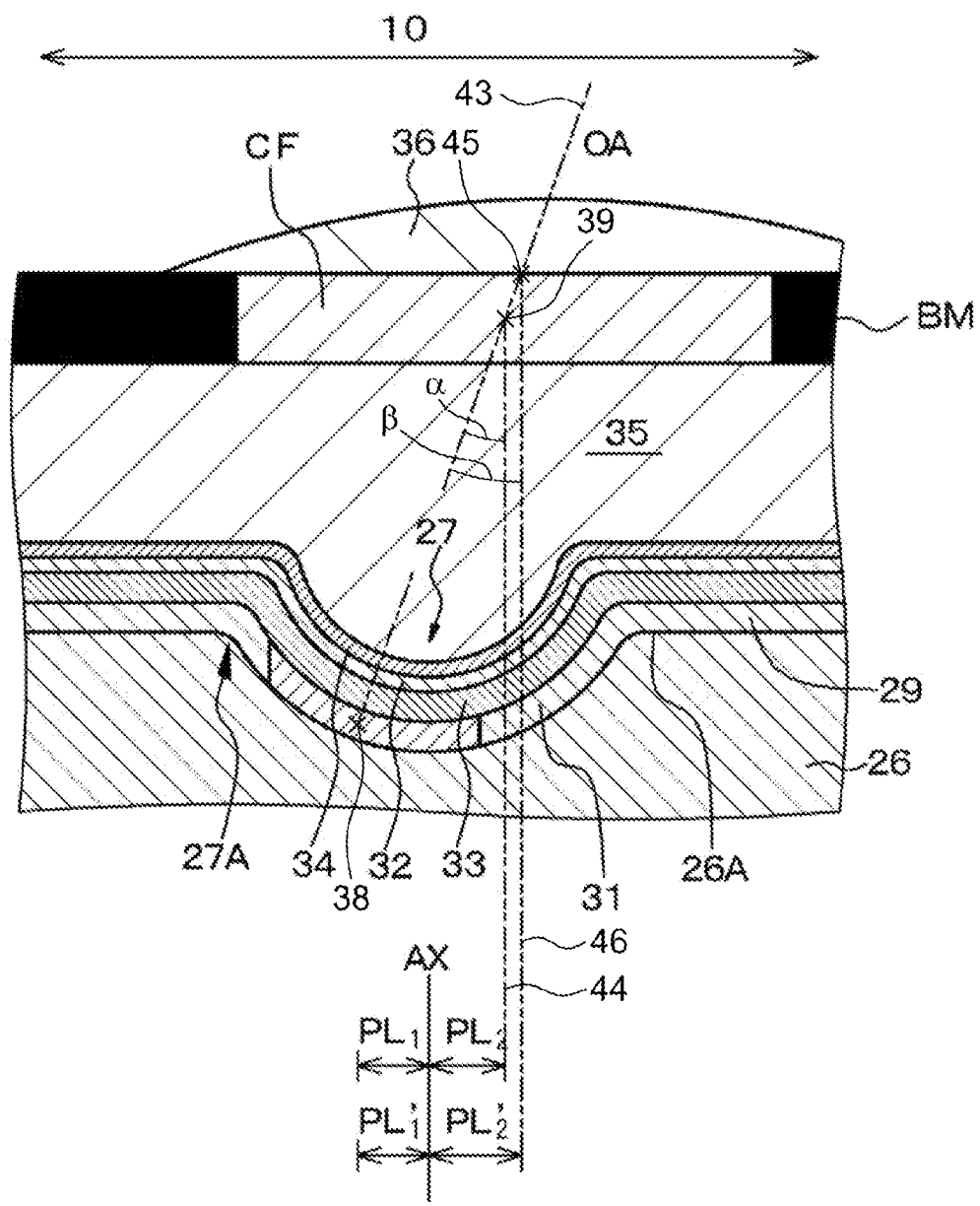
FIG. 9 is a schematic partial end view of a light emission element at a position different from those of FIGS. 7 and 8 in the display device of the third embodiment.

A third embodiment is also a variation of the first embodiment. FIGS. 7, 8, and 9 illustrate schematic partial end views of a light emission element of the third embodiment in a display device of the third embodiment. FIG. 7 illustrates the light emission element positioned at, e.g., a center portion of the display device, FIG. 8 illustrates the light emission element positioned at, e.g., one end portion of the display device, and FIG. 9 illustrates the light emission element positioned at, e.g., the other end portion of the display device. In FIGS. 7, 8, 9, 10, 11, and 12, a contact hole (a contact plug) 28 is not shown.

In the light emission element of the third embodiment, a first electrode layer 31 contacts part of an organic layer 33. Specifically, in this case, it can be configured such that the size of the first electrode layer 31 is smaller than that of the organic layer 33, or it can be configured such that the size of the first electrode layer 31 is larger than that of the organic layer 33. In an illustrated example, the size of the first electrode layer 31 is smaller than that of the organic layer 33. In addition, a color filter layer CF is formed on a planarization layer 35, and a direction (the orthogonal projection direction) from the (central) axis AX (arranged in vertical direction of the image plane of the images shown in FIGS. 7 to 9) of a recessed portion 27 toward a center point 38 (the orthogonal projection center point) of the first electrode layer 31 contacting the organic layer 33 and a direction (the orthogonal projection direction) from the axis AX of the recessed portion 27 toward a center point 39 (the orthogonal projection center point) of the color filter layer CF are in the relationship of opposite directions. In other words, the orthogonal projection center point 38 of the first electrode layer 31 and the orthogonal projection center point 39 of the color filter layer CF are not arranged on the axis AX (in the light emission elements shown in FIGS. 8 and 9), but are displaced (offset) in a direction orthogonal to the axis AX, wherein the orthogonal projection center point 38 of the first electrode layer 31 is arranged on an opposite side of the axis AX than the orthogonal projection center point 39 of the color filter layer CF. Moreover, a distance (the orthogonal projection distance) $PL_1$ from the axis AX of the recessed portion 27 to the orthogonal projection center point 38 of the first electrode layer 31 contacting the organic layer 33 and a distance (the orthogonal projection distance) $PL_2$ from the axis AX of the recessed portion 27 to the orthogonal projection center point 39 of the color filter layer CF are greater as the position of the light emission element is closer to a peripheral portion of the display device. Further, the orthogonal projection center point 38 of the first electrode layer 31, the orthogonal projection center point of the organic layer 33, and an intersection between the axis AX of the color filter layer CF and the base virtual plane are positioned on a substantially straight line 43. The center point is indicated by a cross mark. The above-described form and the following form can be individually and separately applied to the light emission element. In other words, the angle α between the line 43, which is connecting the orthogonal projection center point 38 of the first electrode layer 31 and the orthogonal projection center point 39 of the color filter layer CF, and the line 44, which is going through the orthogonal projection center point 39 and which is parallel to the axis AX, increases the closer the light emission element is arranged to the peripheral portion of the display device. In FIG. 7 the light emission element is arranged in the central area of the display device so that the angle α is zero, while in FIGS. 8 and 9 the light emission element is arranged closer to respective (opposite) peripheral portions so that the angle α is larger than zero, i.e., the color filter layer CF and the recessed portion 27 are displaced (offset) relative to each other in a direction orthogonal to the axis AX.

Alternatively, in the light emission element of the third embodiment, an on-chip microlens 36 is provided on or above a top surface of the planarization layer 35, the first electrode layer 31 contacts part of the organic layer 33, and the direction (the orthogonal projection direction) from the axis AX of the recessed portion 27 toward the center point 38 (the orthogonal projection center point) of the first electrode layer 31 contacting the organic layer 33 and a direction (the orthogonal projection direction) from the axis AX of the recessed portion 27 toward a center point 45 (the orthogonal projection center point) of the on-chip microlens 36 are in the relationship of opposite directions. In other words, the orthogonal projection center point 38 of the first electrode layer 31 and the orthogonal projection center point 45 of the on-chip microlens 36 are not arranged on the axis AX (in the light emission elements shown in FIGS. 8 and 9), but are displaced (offset) in a direction orthogonal to the axis AX, wherein the orthogonal projection center point 38 of the first electrode layer 31 is arranged on an opposite side of the axis AX than the orthogonal projection center point 45 of the on-chip microlens 36. It can be configured such that the size of the first electrode layer 31 is smaller than that of the organic layer 33, or it can be configured such that the size of the first electrode layer 31 is the same as that of the organic layer 33, but an insulating material film 61 is formed at part of a portion between the first electrode layer 31 and the organic layer 33. Alternatively, it can be configured such that the size of the first electrode layer 31 is larger than that of the organic layer 33. In addition, the on-chip microlens 36 is larger than the recessed portion 27. A distance (the orthogonal projection distance) $PL_1'$ from the axis AX of the recessed portion 27 to the center point (the orthogonal projection center point) of the first electrode layer 31 and a distance (the orthogonal projection distance) $PL_2'$ from the axis AX of the recessed portion 27 to a center point (the orthogonal projection center point) of the on-chip microlens 36 are greater as the position of the light emission element is closer to the peripheral portion of the display device. The orthogonal projection center point of the first electrode layer 31, the orthogonal projection center point of the organic layer 33, and the orthogonal projection center point of the on-chip microlens 36 are on a substantially straight line. In other words, the angle β between the line 43, which is connecting the orthogonal projection center point 38 of the first electrode layer 31 and the orthogonal projection center point 45 of the on-chip microlens 36, and the line 46, which is going through the orthogonal projection center point 45 and which is parallel to the axis AX, increases the closer the light emission element is arranged to the peripheral portion of the display device. In FIG. 7 the light emission element is arranged in the central area of the display device so that the angle β is zero, while in FIGS. 8 and 9 the light emission element is arranged closer to respective (opposite) peripheral portions so that the angle β is larger than zero, i.e., the on-chip microlens 36 and the recessed portion 27 are displaced (offset) relative to each other in a direction orthogonal to the axis AX.

As described above, a light emission position in the recessed portion 27 is changed according to the position of the light emission element at the display device so that an optical axis OA of the light emission element can be changed according to the position of the light emission element at the display device. Moreover, with this configuration, in a case where an image from the display device is enlarged and displayed using optical unit (not shown) such as a lens, the display device of the third embodiment is applied according to an arrangement angle between the light emission element and the optical unit forming the display device so that luminance distribution through the optical unit can be improved and occurrence of color mixing can be avoided.

Figure 10:
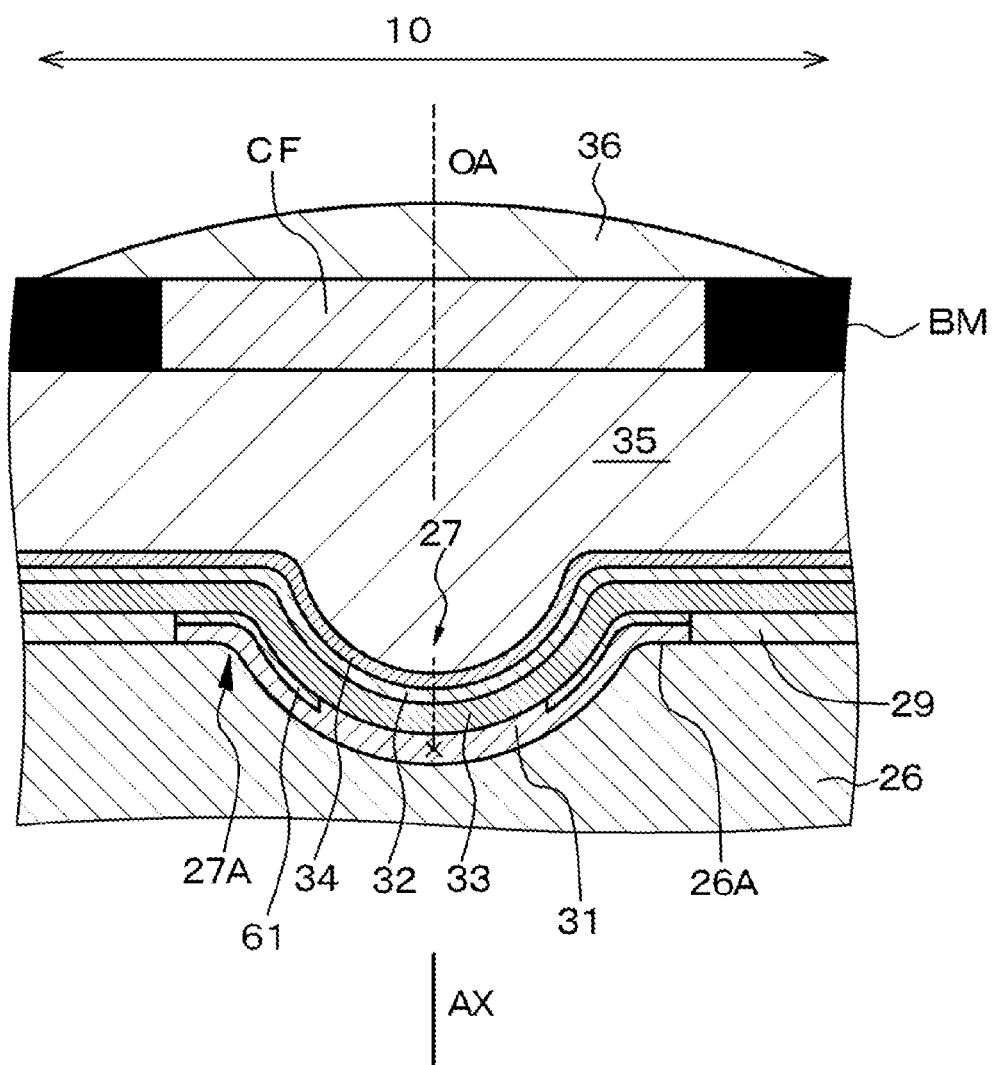
FIG. 10 is a schematic partial end view of a variation of the light emission element in the display device of the third embodiment.
Figure 11:
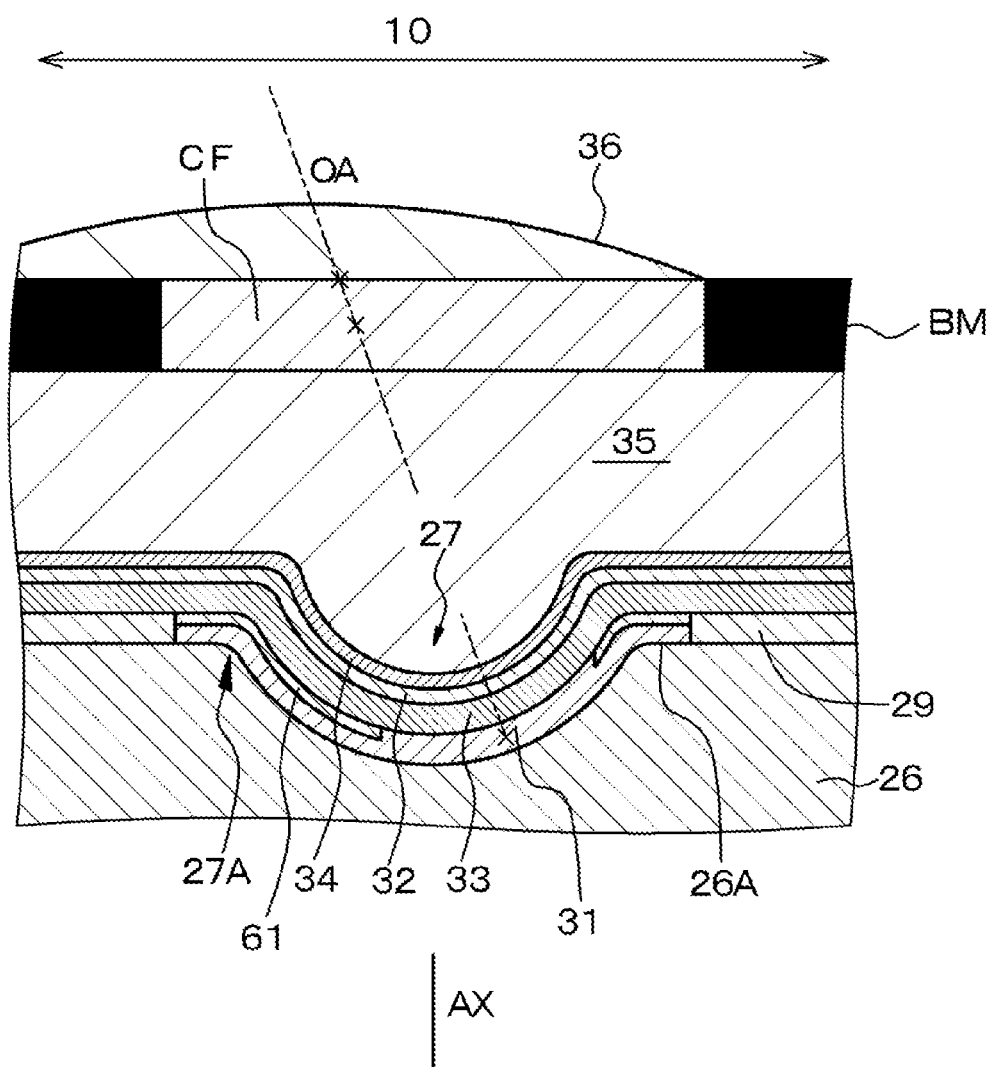
FIG. 11 is a schematic partial end view of a variation of a light emission element at a position different from that of FIG. 10 in the display device of the third embodiment.
Figure 12:
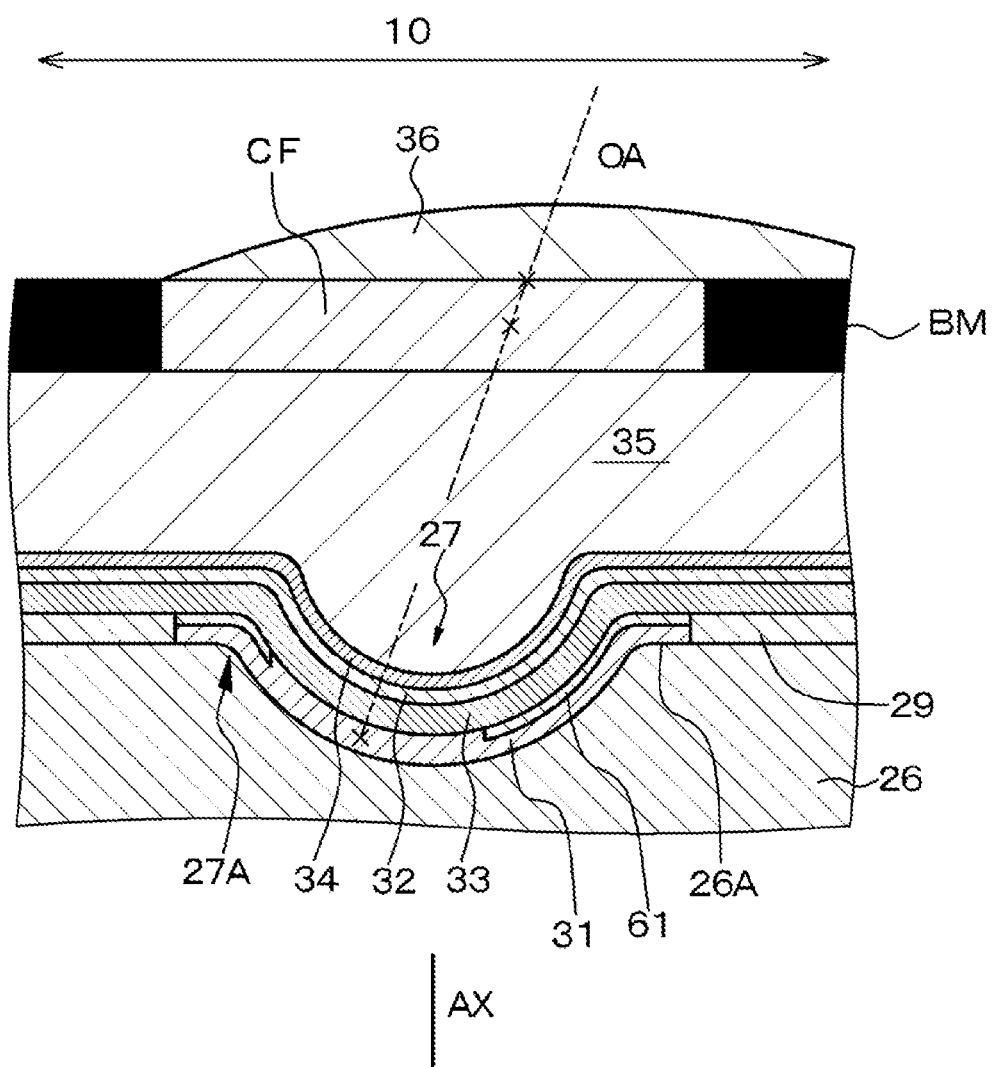
FIG. 12 is a schematic partial end view of a variation of a light emission element at a position different from those of FIGS. 10 and 11 in the display device of the third embodiment.

As illustrated in FIGS. 10, 11, and 12, the size of the first electrode layer 31 in the recessed portion 27 is the same as that of the organic layer 33, but it can be configured such that the insulating material film 61 is formed at part of the portion between the first electrode layer 31 and the organic layer 33. The insulating material film 61 can be formed by an extending portion of the insulating layer 29.

Figure 13:
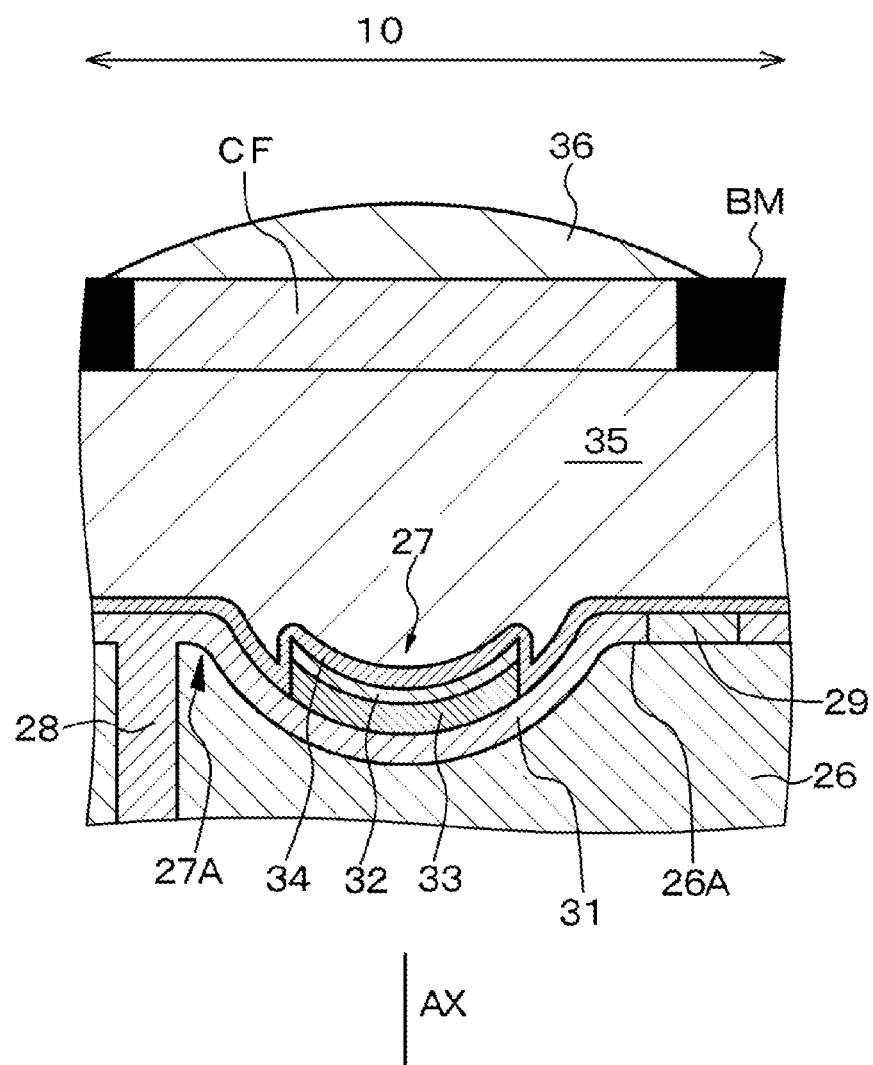
FIG. 13 is a schematic partial end view of a variation of the light emission element of the first embodiment.

The present disclosure has been described above on the basis of the preferred embodiments, but is not limited to these embodiments. The configurations/structures of the display device (the organic EL display device) and the light emission element (the organic EL element) described in the embodiments have been set forth as examples, and changes can be made as necessary. The method for manufacturing the display device has been also set forth as an example, and changes can be made as necessary. For example, the organic layer 33 may be formed only on the bottom portion of the recessed portion 27 as illustrated in FIG. 13 as a schematic partial end view of a variation of the light emission element of the first embodiment. In some cases, the protection film is not necessarily provided. Moreover, in this case, the organic layer 33 and the planarization layer 35 or the second electrode layer 32 and the planarization layer 35 may form the internal lens.

In the embodiments, it is configured such that a single pixel is formed by three sub-pixels by means of a combination of the white light emission element and the color filter layers, but it may be configured such that a single pixel is formed by four sub-pixels including the light emission element configured to emit the white light, for example. Alternatively, it may be configured such that the light emission elements include the red light emission element configured to emit the red light by the organic layer, the green light emission element configured to emit the green light by the organic layer, and the blue light emission element configured to emit the blue light by the organic layer and that there three types of light emission elements (sub-pixels) are combined to form a single pixel. In the embodiments, the light emission element drive portion includes the MOSFET, but may include a TFT. The first electrode layer or the second electrode layer may have a single-layer structure or a multilayer structure.

For preventing occurrence of optical crosstalk due to entrance of light emitted from a certain light emission element into a light emission element adjacent to the certain light emission element, a light shielding layer may be provided between the light emission element and the light emission element. That is, a groove portion may be formed between the light emission element and the light emission element, and may be filled with a light shielding material to form the light shielding layer. With such a light shielding layer, the percentage of entrance of the light emitted from the certain light emission element into the adjacent light emission element can be reduced, and occurrence of, e.g., a phenomenon that the chromaticity of the entirety of the pixel is shifted from desired chromaticity due to color mixing can be reduced. Moreover, since color mixing can be prevented, a color purity upon monochromatic light emission from the pixel can be increased, and a chromaticity point becomes deeper. Accordingly, the color gamut becomes broader, and a color expression range of the display device becomes broader. Moreover, the color filter layer is arranged for each pixel for increasing the color purity. However, depending on the configuration of the light emission element, the thickness of the color filter layer can be reduced, or the color filter layer can be omitted. Moreover, light absorbed by the color filter layer can be extracted. As a result, the light emission efficiency is improved. Alternatively, light shielding characteristics may be provided to the black matrix layer BM.

Figure 19A:
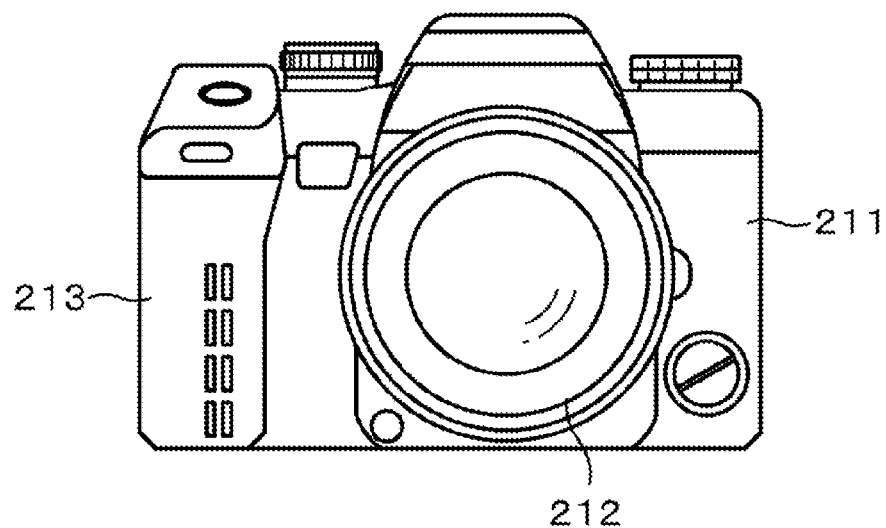
FIGS. 19A and 19B illustrate an example where the display device of an embodiment of the present disclosure is applied to a lens replaceable single-lens reflex digital still camera, a front view of the digital still camera being illustrated in FIG. 19A and a back view being illustrated in FIG. 19B.
Figure 19B:
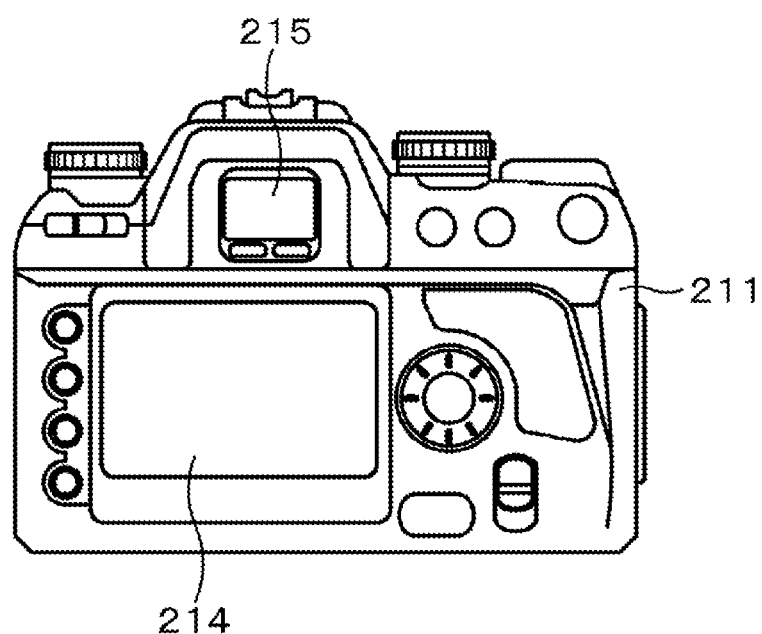

The display device of an embodiment of the present disclosure is applicable to a lens replaceable single-lens reflex digital still camera. A front view of the digital still camera is illustrated in FIG. 19A, and a back view is illustrated in FIG. 19B. This lens replaceable single-lens reflex digital still camera has, for example, a replaceable photographic lens unit (a replaceable lens) 212 on the right side of a camera body portion (a camera body) 211 as viewed from the front, and has a grip portion 213 for gripping by a photographer on the left side as viewed from the front. Moreover, a monitor 214 is provided at the substantially center of a back surface of the camera body portion 211. An electronic view finder (an eyepiece window) 215 is provided above the monitor 214. The photographer looks into the electronic view finder 215 so that an optical image of an object guided from the photographic lens unit 212 can be viewed and a composition can be determined. In the lens replaceable single-lens reflex digital still camera with such a configuration, the display device of an embodiment of the present disclosure can be used as the electronic view finder 215.

Figure 20:
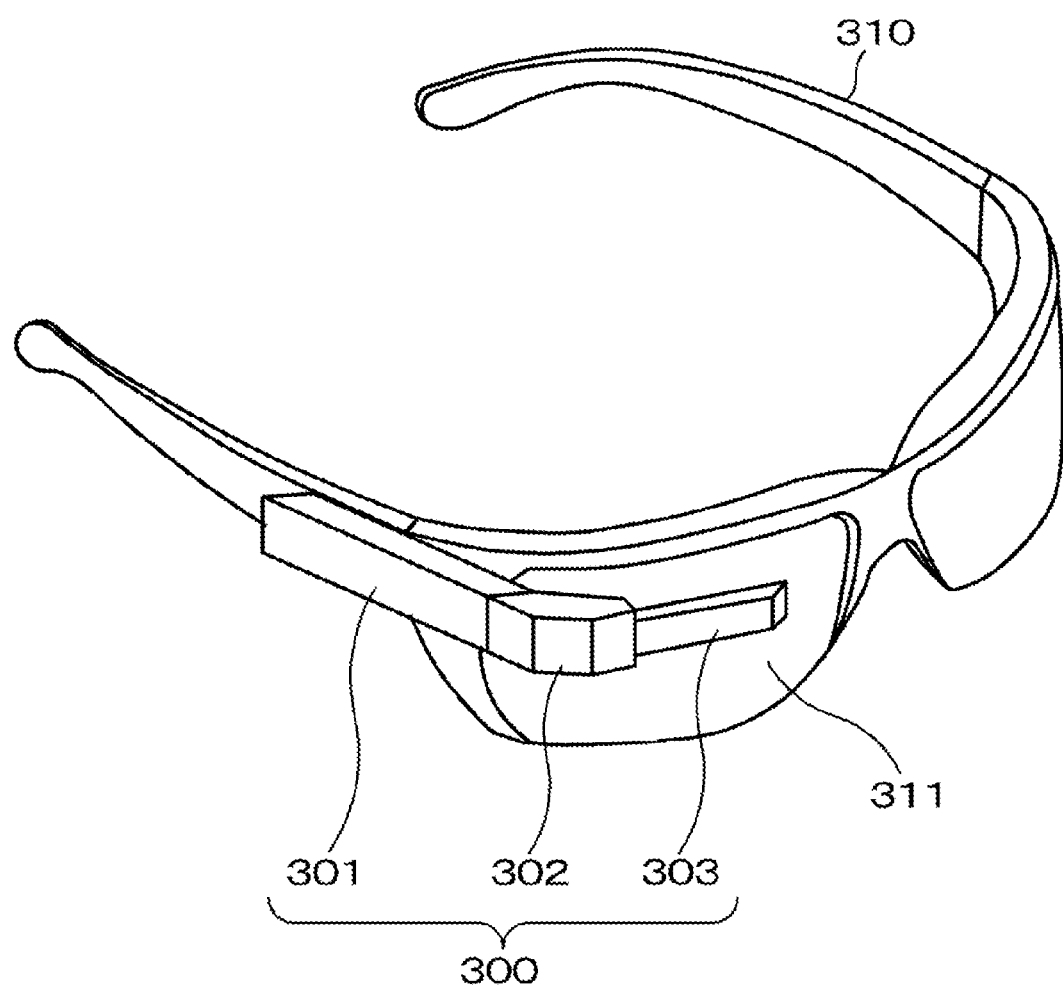
FIG. 20 is an external view of a head mounted display illustrating an example where the display device of an embodiment of the present disclosure is applied to the head mounted display.

Alternatively, the display device of an embodiment of the present disclosure is applicable to a head mounted display. As illustrated in an external view of FIG. 20, a head mounted display 300 is a transmission head mounted display having a body portion 301, an arm portion 302, and a lens barrel 303. The body portion 301 is connected to the arm portion 302 and eye glasses 310.

Specifically, an end portion of the body portion 301 in a long-side direction thereof is attached to the arm portion 302. Moreover, one side of a side surface of the body portion 301 is coupled to the eye glasses 310 via a connection member (not shown). Note that the body portion 301 may be directly attached to a human head. The body portion 301 includes a built-in control board configured to control operation of the head mounted display 300 and a built-in display. The arm portion 302 couples the body portion 301 and the lens barrel 303 to support the lens barrel 303 on the body portion 301. Specifically, the arm portion 302 joins an end portion of the body portion 301 and an end portion of the lens barrel 303, and in this manner, fixes the lens barrel 303 to the body portion 301. Moreover, the arm portion 302 includes a built-in signal line for communicating data regarding to an image provided from the body portion 301 to the lens barrel 303. The lens barrel 303 projects, through a lens 311 of the eye glasses 310, an eye of a user wearing the head mounted display 300 with image light provided from the body portion 301 by way of the arm portion 302. In the head mounted display 300 having the above-described configuration, the display device of an embodiment of the present disclosure can be used as the display built in the body portion 301.

While in the exemplary embodiments explained above an on-chip microlens is provided, in other embodiments of the light emission element according to the present disclosure no such on-chip microlens may be provided.

Further, the exemplary embodiments explained above are top emission (top face emission) display devices (top face emission display devices) configured to emit light from a second substrate. The present disclosure is, however, not limited to such embodiments, but can be configured as bottom emission (bottom face emission) display devices as well.

Figure 21:
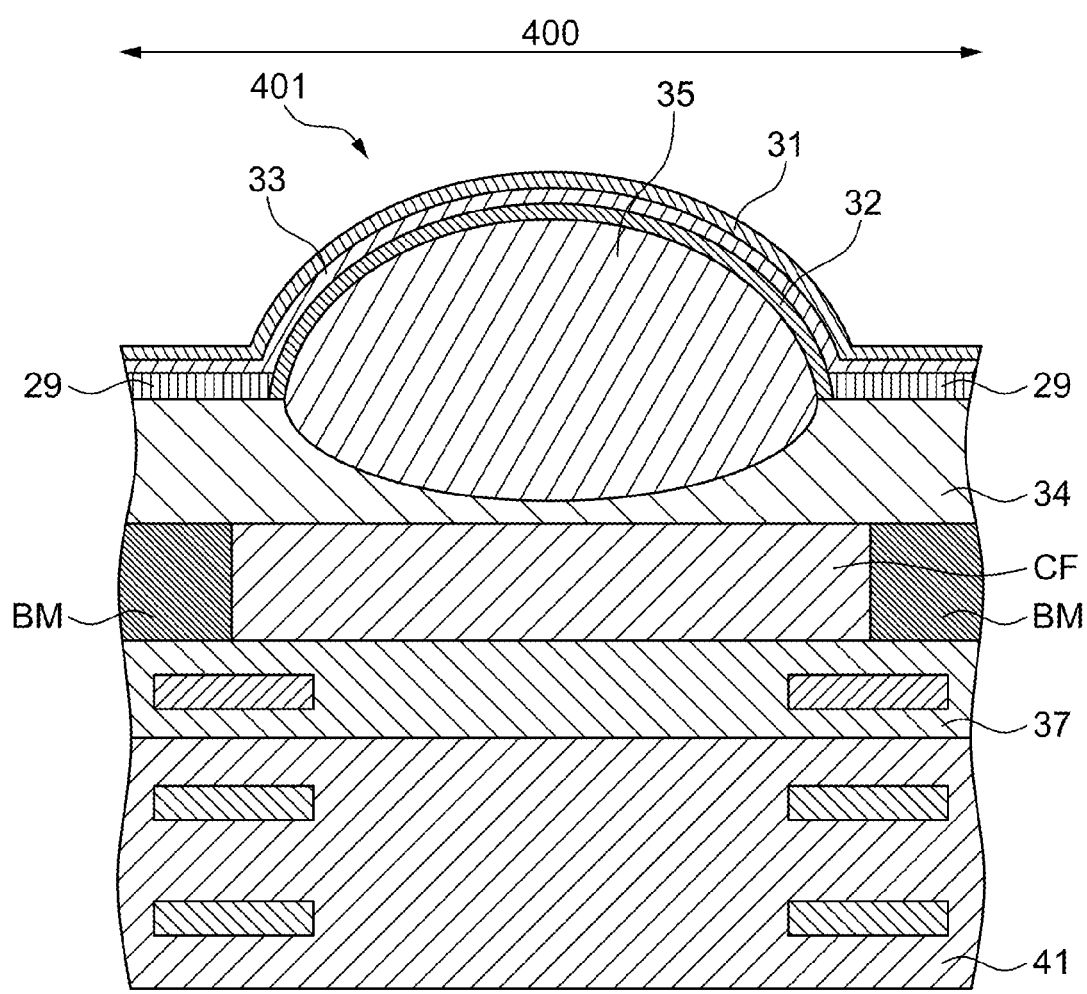
FIG. 21 is a schematic partial end view of part of a light emission element of a bottom face emission embodiment.

FIG. 21 is a schematic partial end view of part of a light emission element 400 of a bottom face emission embodiment. On a TFT substrate (e.g. made of glass) formed by the second substrate 41 and the sealing resin layer 37 the color filter CF (as OCCF) and the black matrix layer BM are formed, which are covered by the protection film 34 (e.g. of SiO with a refractive index of 1.50), e.g. by use of CVD. In the protection film 34 a recess is etched, an a planarization layer 35 is deposited onto the protection film 34. This planarization layer 35 is formed like a lens, onto which the second electrode layer 32, the organic layer 33 and the first electrode layer 31 are formed. Further, to define the light emitting elements an insulating layer 29 is formed on top of the protection film 34. Different from above described light emission element 10 of a top face emission embodiment, the light emission element 400 of a bottom face emission embodiment does not comprise a base 26, in which the recess 27 is formed, but the dome-shaped structure 401 (including the lens-shaped planarization layer 35, the second electrode layer 32, the organic layer 33 and the first electrode layer 31) is formed by subsequently forming the various layer on top of each other on the substrate (second substrate 41 and sealing resin layer 37), the color filter CF and the black matrix layer BM.

Figure 22:
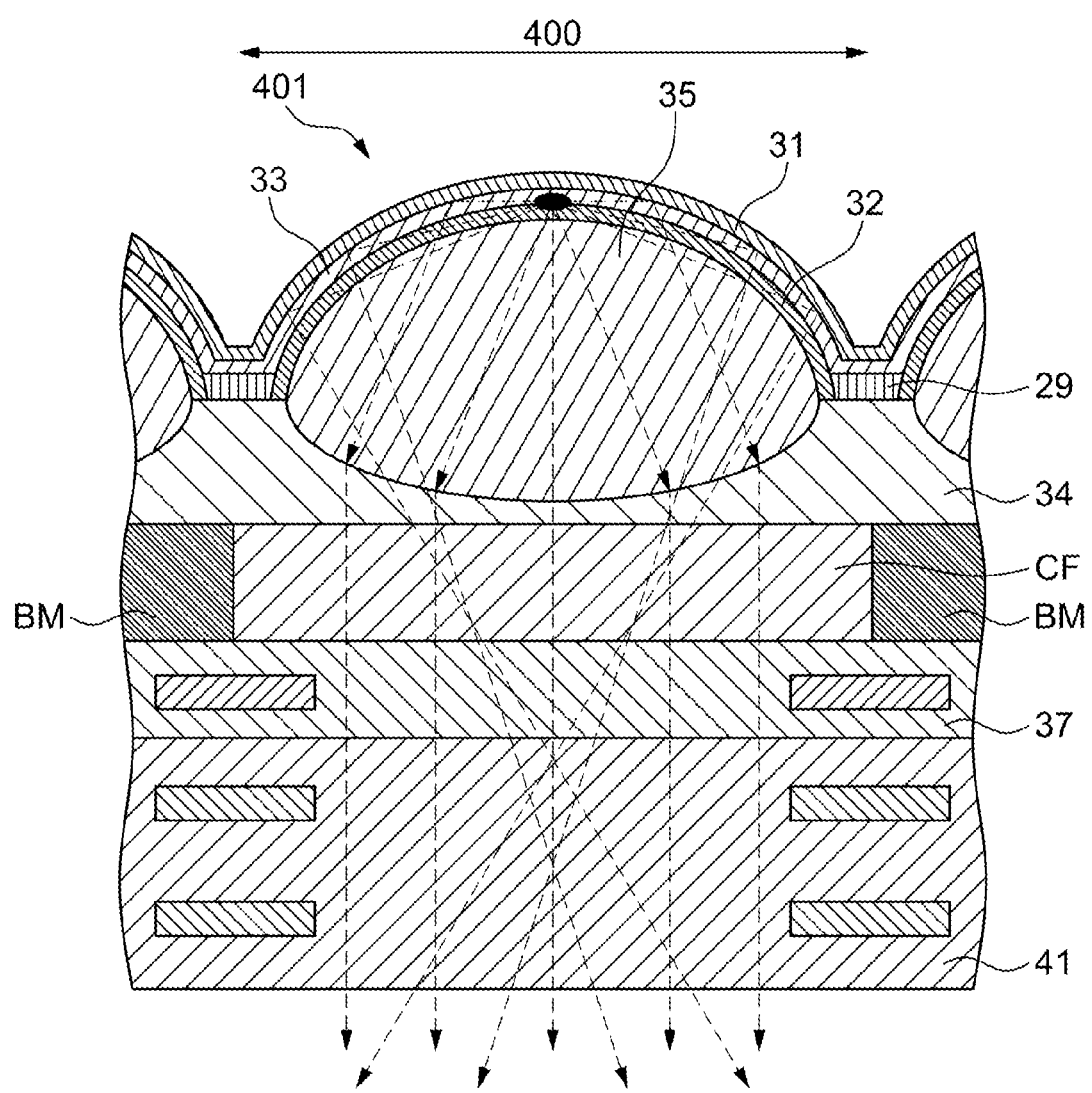
FIG. 22 is a view of a light trajectory in the schematic partial end view of part of the light emission element of the bottom face emission embodiment illustrated in FIG. 21.

FIG. 22 is a view of a light trajectory in the schematic partial end view of part of the light emission element of the bottom face emission embodiment illustrated in FIG. 21. As illustrated in FIG. 22, part of the light emitted from the organic layer 33 passes through the second electrode layer 32 to enter the planarization layer 35, and part of the light emitted from the organic layer 33 is reflected on the first electrode layer 31 to enter the planarization layer 35 through the second electrode layer 32. As described above, the protection film 34 and the planarization layer 35 can form an internal lens, and as a result, the light emitted from the organic layer 33 can be condensed in a direction toward a center side of the light emission element.

Note that the present disclosure may employ the following configurations.

[A01] <<Light Emission Element>>

A light emission element including at least: a base;
a recessed portion provided at a surface of the base;
a first electrode layer formed at least partially along a shape of a top surface of the recessed portion;
an organic layer formed on the first electrode layer at least partially along a shape of a top surface of the first electrode layer;

a second electrode layer formed on the organic layer along a shape of a top surface of the organic layer; and a planarization layer formed on the second electrode layer, in which light from the organic layer is emitted to an outside via the second electrode layer and the planarization layer.

[A02] The light emission element according to [A01], in which a protection film is formed between the second electrode layer and the planarization layer.

[A03] The light emission element according to [A02], in which the protection film is formed along the shape of a top surface of the second electrode layer.

[A04] The light emission element according to [A02] or [A03], in which $n_1 > n_2$ is satisfied, where an index of refraction of a material forming the planarization layer is $n_1$ and an index of refraction of a material forming the protection film is $n_2$.

[A05] The light emission element according to [A04], in which $(n_1 - n_2)$ satisfies 0.1 to 0.6.

[A06] The light emission element according to [A01], in which $$|\theta_i| > |\theta_r|$$

is satisfied in a case of $|\theta_r| \neq 0$, where an incident angle of light emitted from the organic layer and entering the planarization layer through the second electrode layer is $\theta_i$ and an angle of refraction of light having entered the planarization layer is $\theta_r$.

[A07] The light emission element according to any one of [A01] to [A06], in which the planarization layer has a function as a color filter.

[A08] The light emission element according to any one of [A01] to [A07], in which an on-chip microlens is provided on or above a top surface of the planarization layer.

[A09] The light emission element according to any one of [A01] to [A08], in which the first electrode layer contacts part of the organic layer.

[A10] The light emission element according to [A09], in which the size of the first electrode layer is smaller than that of the organic layer.

[A11] The light emission element according to [A09], in which the size of the first electrode layer is larger than that of the organic layer.

[A12] The light emission element according to [A09], in which the size of the first electrode layer is the same as that of the organic layer, and an insulating material film is formed at part of a portion between the first electrode layer and the organic layer.

[A13] The light emission element according to any one of [A09] to [A12], in which a color filter layer is formed on the planarization layer, and a direction from an axis of the recessed portion toward a center point of the first electrode layer contacting the organic layer and a direction from the axis of the recessed portion toward a center point of the color filter layer are in a relationship of opposite directions.

[A14] The light emission element according to [A13], in which a distance from the axis of the recessed portion to a center point of the first electrode layer contacting the organic layer and a distance from the axis of the recessed portion to a center point of the color filter layer are greater as the position of the light emission element is closer to a peripheral portion of a display device.

[A15] The light emission element according to [A13] or [A14], in which the center point of the first electrode layer, a center point of the organic layer, and the axis of the recessed portion are positioned on a straight line.

[A16]

The light emission element according to any one of [A09] to [A15], in which an on-chip microlens is provided on or above a top the first electrode layer contacts part of the organic layer, and a direction from an axis of the recessed portion toward a center point of the first electrode layer contacting the organic layer and a direction from the axis of the recessed portion toward a center point of the on-chip microlens are in a relationship of opposite directions.

[A17]

The light emission element according to [A16], in which the on-chip microlens is larger than the recessed portion.

[A18] The light emission element according to [A16] or [A17], in which the distance from the axis of the recessed portion to the center point of the first electrode layer and a distance from the axis of the recessed portion to a center point of an on-chip microlens are greater as the position of the light emission element is closer to the peripheral portion of the display device.

[A19] The light emission element according to any one of [A16] to [A18], in which the center point of the first electrode layer, the center point of the organic layer, and the center point of the on-chip microlens are positioned on a straight line.

[A20]

The light emission element according to any one of [A01] to [A19], in which a sectional shape of the recessed portion when the recessed portion is cut at a virtual plane including an axis of the recessed portion is a smooth curve.

[A21]

The light emission element according to any one of [A01] to [A19], in which a sectional shape of the recessed portion when the recessed portion is cut at a virtual plane including an axis of the recessed portion is part of a trapezoidal shape.

[A22] The light emission element according to any one of [A01] to [A19], in which a sectional shape of the recessed portion when the recessed portion is cut at a virtual plane including an axis of the recessed portion is a combination of a linear inclined surface and a bottom portion defining a smooth curve.

[A23] The light emission element according to any one of [A01] to [A22], in which a sectional shape from an edge portion of the recessed portion to a surface of the base when the recessed portion is cut at a virtual plane including an axis of the recessed portion includes a smooth curve.

[A24] The light emission element according to any one of [A01] to [A23], in which a shape of an edge portion of the recessed portion is a circular shape or an oval shape.

[A25] The light emission element according to any one of [A01] to [A24], in which $$1/4 \leq Dp/R \leq 1/2$$

is satisfied, where the diameter of a circle assumed to have an area equal to that of the shape of an orthogonal projection image of the recessed portion when the recessed portion is orthogonally projected on a virtual plane including the surface of the base is R and the depth of the recessed portion is Dp.

[A26] The light emission element according to any one of [A01] to [A25], in which the organic layer emits white light.

[A27] The light emission element according to [A26], in which the organic layer has a multilayer structure of a red light emission layer, a green light emission layer, and a blue light emission layer.

[A28] The light emission element according to [A27], in which the organic layer has a resonator structure.

[B01] <<Display Device>>

A display device including:
a first substrate and a second substrate; and multiple light emission elements positioned between the first substrate and the second substrate, provided on a base formed on the first substrate, and arranged in a two-dimensional manner,
in which each light emission element includes at least a recessed portion provided at a surface of the base,
a first electrode layer formed at least partially along a shape of a top surface of the recessed portion,
an organic layer formed on the first electrode layer at least partially along a shape of a top surface of the first electrode layer,
a second electrode layer formed on the organic layer along a shape of a top surface of the organic layer, and a planarization layer formed on the second electrode layer, and
light from the organic layer is emitted to an outside via the second electrode layer, the planarization layer, and the second substrate.

[B02] <<Display Device>>

A display device including
a first substrate and a second substrate, and
multiple light emission elements positioned between the first substrate and the second substrate, provided on a base formed on the first substrate, and arranged in a two-dimensional manner,
in which each light emission element includes the light emission element according to any one of [A01] to [A28].

It should be understood by those skilled in the art that various modifications, combinations, sub-combinations and alterations may occur depending on design requirements and other factors insofar as they are within the scope of the appended claims or the equivalents thereof.

REFERENCE SIGNS LIST 10, 10R, 10G, 10B Light emission element (top emission)
11 First substrate
20 Transistor
21 Gate electrode
22 Gate insulating layer
23 Channel formation region
24 Source/drain region
25 Element isolation region
26 Base (interlayer insulating layer)
26A Surface of base
27 Recessed portion
27A Edge portion of recessed portion
27B Linear inclined surface of recessed portion
27C Bottom portion of recessed portion defining smooth curve
28 Contact plug
29 Insulating layer
31 First electrode layer
32 Second electrode layer
33 Organic layer
34 Protection film
35 ($35_R$, $35_G$, $35_B$) Planarization layer
36 On-chip microlens
37 Sealing resin layer
41 Second substrate
51 Mask layer
52, 53, 54 Resist layer
55 Opening
61 Insulating material film
400 Light emission element (bottom emission)
401 Dome-shaped structure
$CF_R$, $CF_G$, $CF_B$ Color filter layer
BM Black matrix layer

The invention claimed is:

1. A light emitting device comprising:
a substrate;
a color filter disposed above the substrate;
a light emitting element disposed above the color filter, the light emitting element including a first electrode, an organic layer and a second electrode,
the first electrode having a recessed shape or a domed shape in a cross-sectional view,
the second electrode being disposed between the color filter and the first electrode, and
the light emitting element being configured to emit a light towards the substrate; and
a first layer disposed between the light emitting element and the substrate, an upper surface of the first layer having the recessed shape or the domed shape in the cross-sectional view.

2. The light emitting device according to claim 1, wherein the first layer is in contact with the second electrode.

3. The light emitting device according to claim 1, wherein the first layer has a lower surface, the lower surface having another recessed shape or another domed shape opposite to the recessed shape or the domed shape of the upper surface in the cross-sectional view.

4. The light emitting device according to claim 1, further comprising:
a second layer disposed above the substrate, a lower surface of the first layer being in contact with an upper surface of the second layer.

5. The light emitting device according to claim 4, wherein the first layer and the second layer combine to form a lens.

6. The light emitting device according to claim 5, wherein the lens is configured to direct at least part of the light towards the substrate along a vertical axis at a central region of the light emitting element in the cross-sectional view.

7. The light emitting device according to claim 1, wherein the light emitting device is a bottom type light emitting device.

* * * * *